(12) United States Patent
Shigeta

(10) Patent No.: US 6,401,219 B1
(45) Date of Patent: Jun. 4, 2002

(54) FAILURE ANALYSIS SYSTEM, METHOD FOR MANAGING ESTIMATED LOGIC STATUS AND INFORMATION STORAGE MEDIUM FOR PROGRAMMED INSTRUCTION OF THE METHOD

(75) Inventor: Kazuki Shigeta, Tokyo (JP)

(73) Assignee: Nec Corporation, Tokyo (JP)

( * ) Notice: Subject to any disclaimer, the term of this patent is extended or adjusted under 35 U.S.C. 154(b) by 0 days.

(21) Appl. No.: 09/275,812

(22) Filed: Mar. 25, 1999

(30) Foreign Application Priority Data

Mar. 31, 1998 (JP) .......................................... 10-103971

(51) Int. Cl.⁷ .............................................. G06F 11/00
(52) U.S. Cl. .......................................... 714/26; 706/50
(58) Field of Search ............................. 714/26; 700/79; 706/46, 58

(56) References Cited

U.S. PATENT DOCUMENTS 4,964,125 A * 10/1990 Kim
4,967,337 A * 10/1990 English et al.
5,161,158 A * 11/1992 Chakravarty et al.
5,272,704 A * 12/1993 Tong et al.
5,515,503 A * 5/1996 Shimomura et al.
5,548,714 A * 8/1996 Becker et al.

FOREIGN PATENT DOCUMENTS

JP 8-146093 6/1996

OTHER PUBLICATIONS

Artificial Intelligence Structures and Strategies for Complex Problem Solving by George F. Luger and William A. Stubblefield 1992 pp. 100–113, 320–326 and 354–368.*

* cited by examiner

Primary Examiner—Paul R. Myers
(74) Attorney, Agent, or Firm—Young & Thompson

(57) ABSTRACT

A failure analysis system manages pieces of status information estimated by a diagnostic system together with indexes given to the pieces of status information, and builds up a tree-like index structure, wherein a logical relation analyzer and a failure path analyzer are incorporated in the failure analysis system so as to determine candidates of a failure propagation path in the tree-like index structure.

14 Claims, 16 Drawing Sheets

FAILURE ANALYSIS SYSTEM, METHOD FOR MANAGING ESTIMATED LOGIC STATUS AND INFORMATION STORAGE MEDIUM FOR PROGRAMMED INSTRUCTION OF THE METHOD

FIELD OF THE INVENTION

This invention relates to a failure analysis for a semiconductor integrated circuit device and, more particularly, to a failure analysis system, a method for managing estimated logic status and an information storage medium for storing programmed instructions of the method.

DESCRIPTION OF THE RELATED ART

A method for managing estimated logic status is available for a failure analysis system for a sequential circuit disclosed, by way of example, in Japanese Patent Publication of Unexamined Application No. 8-146093. In the following description, term "combinational circuit" expresses a combination of component circuits of an integrated circuit. The prior art failure analysis system backwardly traces a propagation path from a defective output toward an origin of trouble, and dynamically extracts combinational circuits possibly propagating the trouble. The prior art failure analysis system evaluates the extracted combinational circuits, and gives estimated logic status to the extracted combinational circuit. The logic status is given to not only signal lines but also all nodes in the extracted combinational circuit. Signal lines, gates and input/output nodes are examples of the node to be evaluated. The logic status is represented by more than two logic values, i.e., logic "0", logic "1", X which means "don't care", Z which means high-impedance and U which means undefined. When the extracted combinational circuits are linked by using the logic status, the logical link is expected to guide the analyst to the origin of trouble.

An estimated linkage of logic status of each combinational circuit is managed by using the prior art method for managing estimated logic status. Pieces of status information representative of the logic status are registered, retrieved and selectively canceled, and are formed into a tree-like index structure. A large scale integration has a large number of combinational circuits, and more than one logic value is possibly given to each combinational circuit. For this reason, the tree-like index structure for the large scale integration is huge, and the relation between the pieces of status information is less clear to an analyst.

FIG. 1 illustrates a prior art failure analysis system for the estimated logic status. The prior art failure analysis system is broken down into an input-output unit 1, a data processing unit 2 and a memory unit 3. Input data is supplied from the outside through the input-output unit 1 to the data processing unit 2. The data processing unit 2 sequentially executes programmed instructions for a failure analysis, stores pieces of status information for a combinational circuit and a tree-like index structure representative of the logic status in the memory unit 3, and delivers data to be required through the input-output unit 1b.

The input-output unit 1 includes a data input unit 1a and a data output unit 1b. The input unit 1a is a keyboard and a data interface to a diagnostic system (not shown). The output unit 1b is a printer and a data interface to the diagnostic system. The memory unit 3 includes a memory 3a for data information representative of the logic status of combinational circuits and a memory 3b for storing the tree-like index structure. Each of the pieces of status information represents the logic status at a node in a combinational circuit, and the logic status is labeled with an index. A logic value is given to the logic status, and the logic values are logic "1", logic "0", X which means "don't care", Z which means high-impedance and U which means undefined. The node means a signal line, a gate, a gate terminal and an input/output terminal of a component circuit. On the other hand, the tree-like index structure is stored in the memory unit 3b. The tree-like index structure is built for each combinational circuit, and represents a linkage of logic status between the nodes.

The data processing unit 2 includes an instruction analyzer 2a connected to a program memory (not shown), an index marker 2b, a condition analyzer 2c for retrieving conditions and a condition analyzer 2d for deleting conditions. The index marker 2b, the condition analyzer 2c and the condition analyzer 2d are respectively accompanied with a register 2e, a retriever 2f and a deleting means 2g.

The instruction analyzer 2a analyzes an instruction supplied from the input unit 1a, and the data processing unit selectively branches the control to a data registration, a data retrieval and a data deletion. In other words, the control sequence is transferred from the instruction analyzer 2a to the index marker 2b, the retrieving conduction analyzer 2c or the condition analyzer 2d.

The index marker 2b adds an index to the logic status given to a node or a group of nodes to be registered, and transfers the piece of status information representative of the logic status labeled with the index to the register 2e. The index is representative of both of a name of nodes in the combinational circuit and a relation between the nodes. If nodes are branched from a node, the nodes respectively have sub-indexes branched from an index given t o the node. A name is given to each node, and the name of node is also stored so as to make the linkage clear. The register 2e assorts the pieces of status information by the index, and stores the pieces of status information together with the names of the associated nodes. Moreover, the register 2e builds the pieces of status information into a tree-like index structure, and stores the tree-like index structure in the memory unit 3b. While the register 2e is building the pieces of status information into the tree-like index structure, the sub-indexes are located under the index. Thus, lower-level indexes are branched from an upper-level index, and all the indexes are built into the tree-like index structure.

The condition analyzer 2c determines search conditions for a data retrieving to be requested, and supplies the search conditions to the retriever 2f. The retriever 2f searches the memory units 3a/3b for a piece or pieces of status information satisfying the search conditions, and supplies the search result to the output unit 1b.

The condition analyzer 2d determines search conditions for a deletion of a piece of or pieces of status information from the contents of the memory units 3a/3b, and supplies the search conditions to the deleting means 2g. The deleting means 2g deletes a piece of pieces of status information satisfying the search conditions from the contents of the memory units 3a/3b.

FIG. 2 illustrates the control sequence achieved by the prior art failure analysis system, and FIG. 3 illustrates a tree-like index structure built by the prior art failure analysis system. The tree-like index structure is finally achieved through repetition of the control sequence shown in FIG. 2. F1 to F16 are indicative of the names of nodes incorporated in a combinational circuit, and numeral "0" in a circle to numeral "15" in a circle are representative of the indexes each given to a group of nodes such as (F1, F2). FIG. 4 shows a logic path from the index "0" through the indexes "1" and "3" to the index "6" and the index "8" in the tree-like index structure, and FIG. 5 shows another logic path from the index "0" through the indexes "1" and "4" to the index "10" and the index "12" in the tree-like index structure. The logic paths are determined through the execution of the program sequence shown in FIG. 2.

The prior art control sequence is firstly described hereinbelow. Assuming now that a programmed instruction code is supplied from the input unit 1a to the instruction analyzer 2a, the instruction analyzer 2a sequentially checks the instruction code at steps SP1/SP2/SP3, and transfers the control to the index marker 2b, the condition analyzer 2c and the condition analyzer 2d. In detail, the instruction analyzer 2a firstly checks the programmed instruction to see whether or not the programmed instruction requests the registration as by step SP1. If the answer at step SP1 is given affirmative, the instruction analyzer 2a transfers the control to the index marker 2b, and the index marker 2b starts the registration as described hereinlater in detail.

On the other hand, if the answer at step SP1 is given negative, the instruction analyzer 2a checks the programmed instruction to see whether or not the programmed instruction re(quests the retrieval as by step SP2. If the answer at step SP2 is given affirmative, the instruction analyzer 2a transfers the control to the condition analyzer 2c, and the condition analyzer 2c cooperates with the retriever 2f for the retrieval of data as described hereinlater.

On the other hand, if the answer at step SP2 is given negative, the instruction analyzer 2a checks the programmed instruction to see whether or not the programmed instruction requests a deletion. If the answer at step SP3 is given affirmative, the instruction analyzer 2a transfers the control to the condition analyzer 2c, and the condition analyzer 2d cooperates with the deleting means 2g for deleting data as described hereinlater.

When the instruction analyzer 2a determines the programmed instruction to request the registration, the index marker 2b adds an index to the logic status for the purpose of data discrimination as by step SP4. A group of the names assigned the nodes and logic value assigned thereto are incorporated in a piece of status information representative of the logic status, and a single index is given to the logic status. It is assumed that an upper-level index had been known. The logic status was estimated for the lower-level index or the sub-index on the basis of the pieces of status information for the upper-level index. The piece of status information is supplied to the register 2e together with the index, and the register 2e stores the pieces of status information and the index in the memory unit 3a as by step SP5. If the index is a sub-index, the linkage between the index and the sub-index is also stored in the memory unit 3a.

If the instruction analyzer 2a determines the given programmed instruction to request a data retrieval, the condition analyzer 2c analyzes given data, and determines conditions for a search as by step SP6. The search conditions are transferred from the condition analyzer 2c to the retriever 2f, and the retriever 2f searches the memory units 3a/3b for a piece of status information satisfying the search conditions as by step SP7. The result of the retrieval is output through the output unit 1b as by step SP8.

If the instruction analyzer 2a determines the given programmed instruction to request a deletion, the condition analyzer 2d analyzes given data, and determines conditions for a search. The search conditions are transferred from the condition analyzer 2d to the deleting means 2g, and the deleting means 2g deletes a piece of status information satisfying the search conditions together with the given index.

Description is hereinbelow made on part of the work of building the tree-like index structure with reference to FIGS. 4/5. Circuits 4a/4b/4c/4d form a combinational circuit (see FIG. 4), and circuits 4a/4b/4c/4e form another combinational circuit (see FIG. 5). Unexpected output signals are assumed to appear at the terminals F1 and F2. The terminal F1/F2 is hereinbelow referred to as "defective terminal". Index "0" was assigned to the defective terminals F1/F2, and a piece of status information at the defective terminals F1/F2 and the index "0" have been already stored in the memory units 3a/3b.

A programmed instruction is representative of a request for the retrieval, and is supplied from the input unit 1a to the instruction analyzer 2a upon completion of step SP2. The instruction analyzer 2a transfers the programmed instruction to the condition analyzer 2c, and the condition analyzer 2c determines search conditions to be a defective terminals not estimated yet at step SP6. The retriever 2f searches the memory units 3a/3b for the piece of status information satisfying the search conditions at step SP7. The retriever 2f finds the piece of status information representative of the terminals F1/F2 assigned index "0". The retriever 2f transfers the search result indicting the defective terminals F1/F2 to the output unit 1b, and the output unit 1b outputs a search report at step SP8.

The prior art failure analysis system selects the circuit 4a on the basis of the search report for the defective terminal F1/F2 assigned index "0", and estimates the logic status of the circuit 4a. Then, two kinds of logic status are determined. One of them is representative of a failure propagation path from the terminal F3 to the terminals F1/F2, and the other is representative of another failure propagation path from the terminal F4 to the terminals F1/F2 (see FIG. 3).

The prior art failure analysis system instructs the data processing unit 2 to register pieces of status information representative of the two kinds of logic status. The instruction analyzer 2a determines the given instruction to request a registration. The control is transferred to the index marker 2b. The index marker gives index "1" and index "2" to the pieces of status information (see FIG. 3) at step SP4. Index "1" and "2" are respectively assigned to the pieces of status information representative of the failure propagation path from the terminal F3 to the terminals F1/F2 and the logic status representative of the failure propagation path from the terminal F4 to the terminals F1/F2. Thereafter, the resister 2e stores the pieces of status information, i.e., the names of nodes or terminals and the logic value given to one kind of logic status and the names of nodes or terminals and the logic value given to the other kind of logic status in the memory units 3a, and inserts indexes "1" and "2" in the tree-like index structure stored in the memory unit 3b as lower-level indexes branched from index "0" at step SP5.

Upon completion of the registration, the prior art failure analysis system returns to step SPO, and searches the memory units 3a/3b for a terminal not estimated yet. The terminals F3/F4 are found, and the prior art failure analysis system repeats steps SP2, SP6, SP7 and SP8 for each of the terminals F3/F4.

The terminal F3 with index "1" relates to the circuit 4b, and the prior art failure analysis system extracts the circuit 4b from the combinational circuit. The prior art failure analysis system estimates the logic status of the circuit 4b.

Two kinds of logic status are estimated. One of the two kinds-of logic status is representative of a failure propagation path from the terminal F3 to the terminals F5/F6 shown in FIG. 4, and the other kind of logic status is representative of a failure propagation path from the terminal F3 to the terminals F5/F7 shown in FIG. 5.

The prior art failure analysis system requests the data processing unit 2 to register the two kinds of logic status. The data processing unit 2 repeats the control sequence described hereinbefore, and stores the two kinds of logic status together with indexes "3" and "4". Indexes "3" and "4" are inserted into the tree-like index structure as sub-indexes of index "1".

The other terminal F4 has been assigned index "2", and the prior art failure analysis system extracts a circuit from another combinational circuit, and estimates the logic status for the extracted circuit. Only one kind of logic status is obtained through the estimation, and is representative of a failure propagation path from the terminal F8 to the terminal F4 (see FIG. 3). The prior art failure analysis system instructs the data processing unit 2 to register the logic status for the extracted circuit. The data processing unit 2 repeats the above-described control sequence so as to store the logic status together with index "5" in the memory unit 3a and insert index "5" in the tree-like index structure in the memory unit 3b as a sub-index of index "2".

Upon completion of the registration, the prior art failure analysis system instructs the condition analyzer 2c and the retriever 2f to search the memory 3 for terminals not estimated yet, and the retriever 2f finds the terminals F5/F6 of index "3", the terminals F5/F7 of index "4" and the terminal F8 of index "5". The prior art failure analysis system repeats the above-described control sequence for each of the terminals F5/F6, F5/F7 and F8.

In this way, the prior art failure analysis system repeats the program sequence shown in FIG. 2 for terminals not estimated yet, and, finally, completes the tree-like index structure shown in FIG. 3. The indexes are hierarchically built up into the tree-like index structure, and the links represent the relation between the upper-level indexes and the lower-level indexes. The indexes are associated with the defective terminals as shown.

The linkage shown in FIG. 4 is indicative of the following estimation. The defective terminal F3 is estimated on the basis of the logic status labeled with index "1" which has been determined from the defective terminals F1/F2 labeled with index "0". The defective terminals F5/F6 are estimated on the basis of the logic status labeled with "3" for the terminal F3, and the defective terminals F9 and F11 are estimated on the basis of the logic status labeled with "6" for the defective terminal F5 and the logic status labeled with "8" for the defective terminal F6.

Similarly, the linkage shown in FIG. 5 is indicative of the following estimation. The defective terminal F3 is estimated as similar to the linkage shown in FIG. 4, and the defective terminals F5/F7 are estimated on the basis of the logic status labeled with "4" for the terminal F3, and the defective terminals F9 and F13 are estimated on the basis of the logic status labeled with "10" for the defective terminal F5 and the logic status labeled with "12" for the defective terminal F7.

An analyst acquires a piece of knowledge from the tree-like index structure that the estimation proceeds from index "0" through index "1" to index "3". In other words, the tree-like index structure teaches the analyst the heretical relation between upper-level indexes and lower-level indexes. However, the tree-like index structure does not teach a logical relation between the indexes such as the AND relation or the OR relation. When two kinds of logic status are concurrently realized, they are in the AND relation. On the other hand, if two kinds of logic status are never concurrently realized, they are in the OR relation. Focusing attention on indexes "3", "6", "7", "8" and "9", by way of example, the tree-like index structure teaches that the four kinds of logic status "6", "7", "8" and "9" are estimated from the kind of logic status "3". It is unknown that what kind of logic relation is found between the four kinds of logic status "6", "7", "8" and "9". Because the logic status is not linked with any one of the two circuits relating to the terminals F5/F6. If all the relations between the indexes are registered, the analyst is to register a large number of combinations between the indexes, and the registration consumes a large, amount of time and labor. Thus, the analyst encounters a first problem in the prior art failure analysis system in that the tree-like index structure can not express any logical relation between the indexes.

The second problem is that the prior art failure analysis system can not specify the inside of the circuit, because the prior art failure analysis system does not select AND relations from the linkage.

The third problem is that the prior art failure analysis consumes a long time. As shown in FIG. 3, indexes "6"/"10" and "7"/"11" are branched from index "3" and index "4", respectively. However, both indexes "6" and "10" are given to the logic status for the defective terminal F9. Similarly, both indexes "7" and "11" are given to the logic status for the defective terminal F10. This means that the estimation is repeated for the terminals F9/F10. The repetition increases the amount of estimation, and prolongs the time period for the failure analysis.

SUMMARY OF THE INVENTION

It is therefore an important object of the present invention to provide a failure analysis system, which is free from the problems inherent in the prior art failure analysis system.

It is also an important object of the present invention to provide a method of managing estimated logic status available for the failure analysis system.

It is also an important object of the present invention to provide an information storage medium for storing programmed instructions of the method.

The present inventor contemplated the first to third problems, and noticed that the source of those problems was that the prior art failure analysis system could not determine the logical relation between the kinds of logic status labeled with different indexes.

In accordance with one aspect of the present invention, there is provided a failure analysis system for a sequential circuit containing plural circuits comprising an index marker receiving pieces of status information each representative of a failure propagation path in one of the plural component circuits, and selectively labeling the pieces of status information with indexes in such as manner one of the pieces of status information is labeled with an index serving as an upper level index with respect to other or others of the pieces of status information closer to candidates of an failure origin than the one of the pieces of status information, a group organizer checking the indexes to see whether or not one or ones of the indexes are branched from another of the indexes serving as the upper level index, and giving a tag to the one or ones of the indexes when the one or ones of the indexes are branched from the another of the indexes, thereby selectively giving tags to the indexes, and a logical relation analyzer checking the indexes and the tags to see whether more than one piece of status information is established in an AND relation or an OR relation.

In accordance with another aspect of the present invention, there is provided a method of managing estimated logic status for a sequential circuit containing plural component circuits comprising the steps of a) acquiring pieces of status information each representative of a degradation of a failure propagation path in one of the plural component circuits and selectively labeled with indexes to be built in a tree-like index structure so as to indicate a relation of the failure propagation paths from candidates of a failure origin in the sequential circuit to a signal output port of the sequential circuit, one of the indexes given to one of the propagation paths closer to the signal output port serving as an upper level index in the tree-like index structure with respect to other or others of the indexes given to other or others of the propagation paths closer to the candidates and connected to the one of the propagation paths, b) checking the tree-like index structure to see whether one of or ones of the indexes are branched from another of the indexes serving as the upper level index so as to give a tag to the one or ones of the indexes when the one or ones of the indexes are branched from the another of indexes, thereby selectively giving tags to an index or a group of indexes incorporated in the tree-like index structure, c) checking the indexes to see whether or not the tag is shared between more than one of the indexes, and d) determining a logical relation between the more than one of the indexes to be an OR relation when the tag is shared and an AND relation when the tag is not shared.

In accordance with yet another aspect of the present invention, there is provided a information storage medium for storing a sequence of programmed instruction for a method of managing estimated logic status for a sequential circuit containing Plural component circuits, and the method comprises the steps of a) acquiring pieces of status information each representative of a degradation of a failure propagation path in one of the plural component circuits and selectively labeled with indexes to be built in a tree-like index structure so as to indicate a relation of the failure propagation paths from candidates of a failure origin in the sequential circuit to a signal output port of the sequential circuit, one of the indexes given to one of the propagation paths closer to the signal output port serving as an upper level index in the tree-like index structure with respect to other or others of the indexes given to other or others of the propagation paths closer to the candidates and connected to the one of the propagation paths, b) checking the tree-like index structure to see whether one of or ones of the indexes are branched from another of the indexes serving as the upper level index so as to give a tag to the one or ones of the indexes when the one or ones of the indexes are branched from the another of indexes, thereby selectively giving tags to an index or a group of indexes incorporated in the tree-like index structure, c) checking the indexes to see whether or not the tag is shared between more than one of the indexes, and d) determining a logical relation between the more than one of the indexes to be an OR relation when the tag is shared and an AND relation when the tag is not shared.

BRIEF DESCRIPTION OF THE DRAWINGS

The features and advantages of the failure analysis system, the method and the information storage medium for programmed instructions will be more clearly understood from the following description taken in conjunction with the accompanying drawings in which.

DESCRIPTION OF THE PREFERRED EMBODIMENTS

First Embodiment

Figure 6:
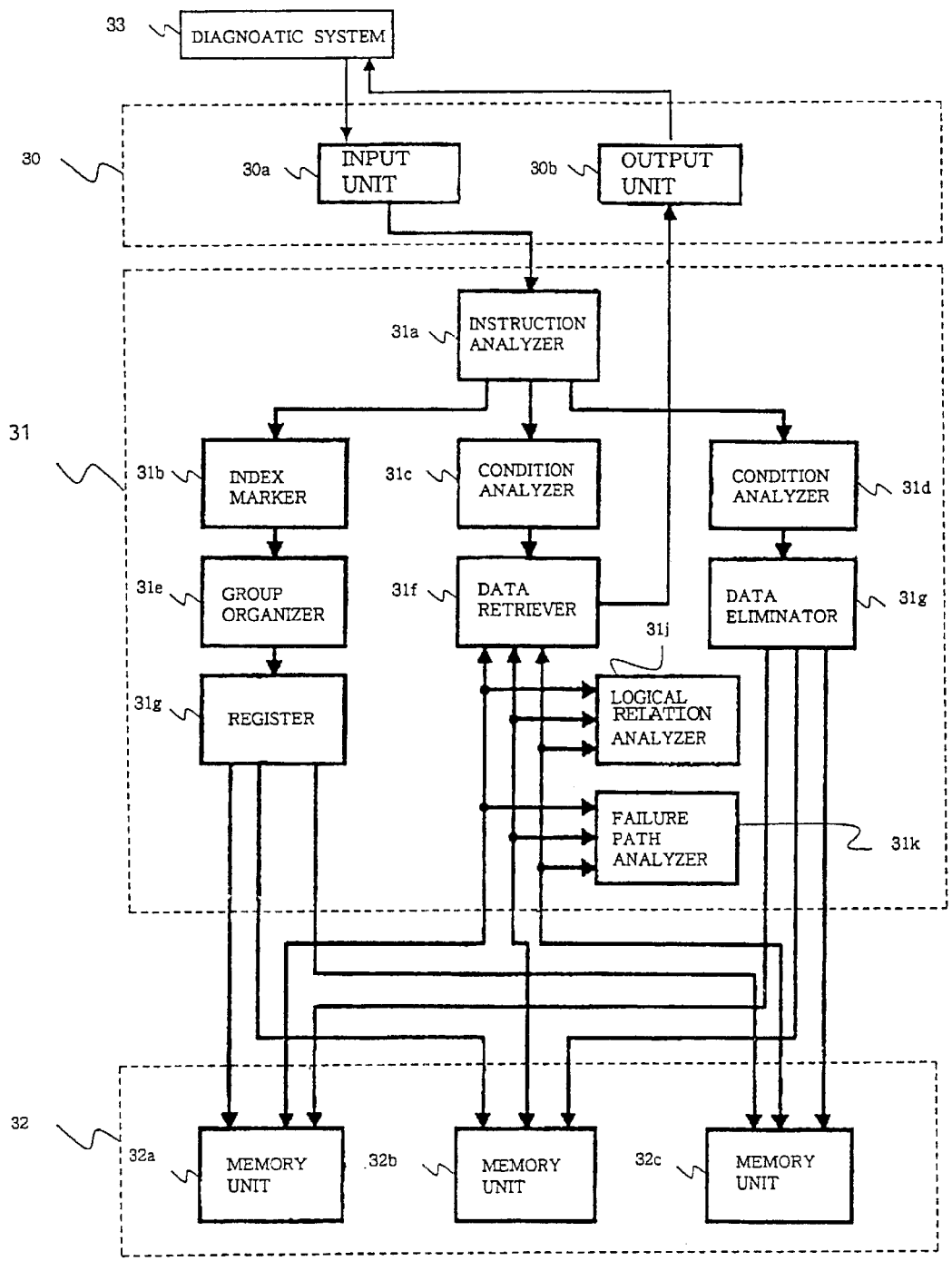
FIG. 6 is a block diagram showing the arrangement of components incorporated in a failure analysis system according to the present invention.

Referring to FIG. 6 of the drawings, a failure analysis system embodying the present invention largely comprises a data input-output facility 30, a data processing unit 31 and a data storage 32. An analyst instructs the failure analysis system to achieve a given task through the data input-output facility 30, and the data processing unit 31 executes programmed instructions for the given task. Pieces of status information, indexes and a tree-like index structure are stored in the memory 32, and the data processing unit 31 produces a report from the data information stored in the memory 32. The data processing unit 31 outputs the report through the input-output facility 30.

The input-output facility 30 includes an input unit 30a and an output unit 30b. The input unit 30a has a keyboard and a data interface for a diagnostic system 33. An analyst gives instructions through the keyboard to the input unit 30a, and the diagnostic system 33 transfers pieces of status information to the data interface. On the other hand, the output unit 30b has a display unit, a printer and a data interface to the diagnostic system 33. The analyst receives a search report and other results through the display and the printer, and a request for an estimation and related data are supplied from the output unit 30b to the diagnostic system 33.

The memory 32 has three memory units 32a, 32b and 32c. Indexes and associated pieces of status data information are stored in the memory unit 32a, and a tree-like index structure is built up in the memory unit 32b. Each piece of status information has a logic value selected from logic "0", logic "1", X which means don't care, Z which means high impedance and U which means undefined. The logic value is given to all of the nodes in a combinational circuit or part of the nodes in the combinational circuit. A signal line, a gate, a gate electrode and input/output terminals are examples of the node. A name is given to each node, and is called as "node name" in the following description. Therefore, a piece of status information contains a node name and a logic value given thereto or node names and logic values respectively given thereto.

The memory unit 32c is assigned pieces of control data information each representative of a group of indexes assigned to pieces of status data information estimated in parallel to one another for a node of a combinational circuit.

The data processing unit 31 includes an instruction analyzer 31a, an index marker 31b and condition analyzers 31c/31d. The instruction analyzer 31a receives the instruction, and interprets a request incorporated in the instruction. The instruction is representative of a registration, a data retrieval and a data elimination, and the control is branched to one of the index marker 31b, the condition analyzer 31c and the other condition analyzer 31d depending upon the interpretation. The index marker 31b labels a piece of status information with an index. The condition analyzers 31c and 31d determine search conditions for a piece or pieces of status information and the indexes to be reported and search conditions for a piece or pieces of status information and the indexes to be deleted.

The data processing unit 31 further includes a group organizer 31e, a data retriever 31f, a data eliminator 31g, a register 31h, a logical relation analyzer 31j and a failure path analyzer 31k. The group organizer 31e, the logical relation analyzer 31j and the failure path analyzer 31k are newly incorporated in the failure analysis system according to the present invention.

The group organizer 31e gives a tag to a piece or pieces of status information estimated in parallel to one another. In other words, if pieces of status information are labeled with a tag, the associated indexes are branched from a particular upper-level index.

Using the index as a unit, the register 31g register 31g stores the pieces of status information in the memory unit 32a, and builds a tree-like index structure in the memory unit 32b. If pieces of status information are estimated on the basis of a piece of status information labeled with a particular index, the particular index and the indexes given to the pieces of status information are inserted into the tree-like index structure as an upper-level index and lower-level indexes to be branched from the upper-level index. The register 31g further stores the relation between the tags and the indexes. If pieces of status information belong to a particular group labeled with a tag, the indexes given to the pieces of status information are stored in the memory unit 32c under the particular tag.

The data retriever 31f receives the search conditions from the condition analyzer 31c, and searches the memory units 32a/32b/32c for a piece or pieces of status information, an index/indexes and/or a tag satisfying the search conditions. When the data retriever 31f finds it or them, the data retriever 31f transfers the piece or pieces of status information, the index/indexes and/or the tag to the output unit 30b, and the output unit 30b produces a search report for these pieces of information.

The condition analyzer 31d determines search conditions for a piece or pieces of status information, an index/indexes and/or a tag to be eliminated from the contents of the memory units 32a/32b/32c. The search conditions are transferred from the condition analyzer 31d to the data eliminator 31g. The data eliminator 31I searches the memory units 32a/32b/32c for a piece or pieces of status information, an index/indexes and/or a tag satisfying the search conditions. When the piece or pieces of status information, the index/indexes and/or the tag are found, they are eliminated from the contents of the memory units 32a/32b/32c.

The logical relation analyzer 31j checks the tree-like index structure and the contents of the memory unit 32c to see what kind of logical relation is found. If it is impossible that two pieces of status information can concurrently take place, the two pieces of status information are in the AND relation. On the other hand, if the two pieces of status information can concurrently take place, they are in the OR relation.

The failure path analyzer 31k analyzes the contents of the memory units 32a/32b/32c in order to find a failure propagation path in a given combinational circuit.

Figure 7:
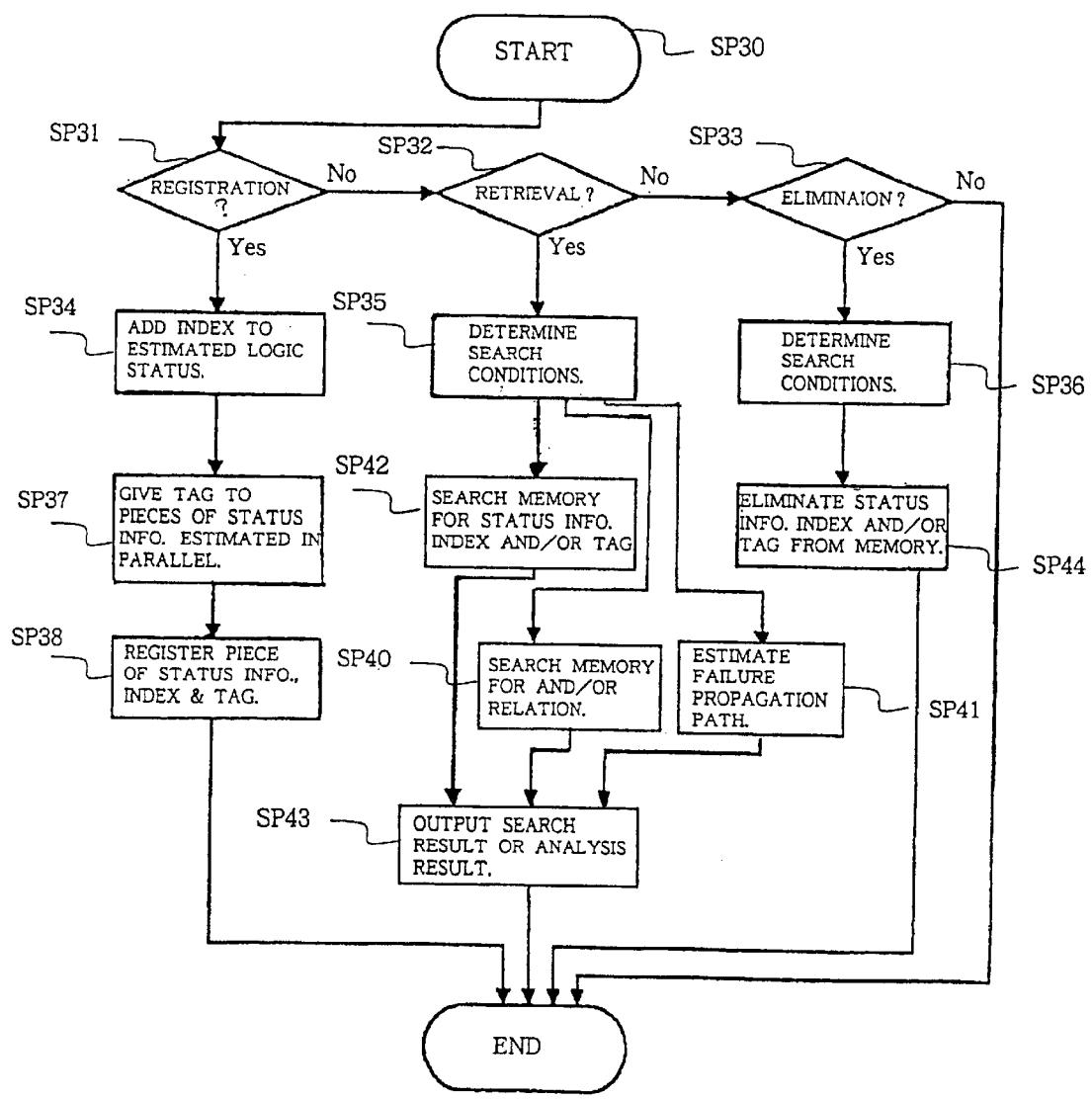
FIG. 7 is a flow chart showing a program sequence executed by the failure analysis system.

The failure analyzer according to the present invention behaves as follows. FIG. 7 illustrates a program sequence executed by the failure analysis system. When an instruction is transferred from the input unit 30a to the instruction analyzer 31a, the failure analysis system starts the program sequence at step SP30, and sequentially checks the instruction to see what job is to be requested as by steps SP31, SP32 and SP33. If the instruction requests the failure analysis system to newly register a piece of status information, the control is branched from step SP31 to step SP34. If the instruction requests the failure analysis system to search a particular piece or pieces of status information, the associated index/indexes and the tag, the control is branched from step SP32 to step SP35. If the instruction requests the failure analysis system to eliminate a particular piece or pieces of status information, the associated index/indexes and the tag from the memory units 32a/32b/32c, the control is branched from step SP32 to step SP36.

Assuming now that the job to be requested is a registration, the index marker 31b adds an index to a piece of status information representative of logic status estimated by the diagnostic system 33 as by step SP34. The piece of status information contains plural logic values at respective nodes. If the estimation is carried out on the basis of logic status at a node labeled with an upper-level index, the upper-level index is known to the index marker 31b, and the index marker 31b determines the new index not to be conflict with the upper-level index.

Subsequently, the piece of status information labeled with the index is transferred to the group organizer 31e. The group organizer 31e specifies other pieces of status information estimated in parallel to the piece of status information, and gives a tag to the pieces of status information estimated in parallel to one another as by step SP37. The tag is indicative of a group number assigned to those pieces of status information.

The piece of status information labeled with the index is transferred to the register 31g together with the tag, and the register 31g stores the piece of status information, the index and the tag in the memory units 32a/32b/32c as by step SP38. In the memory unit 32a, the index is used as unit, and the logic values at the related nodes and the node names are stored under the index. The index is linked with the upper-level index in order to build a tree-like index structure in the memory unit 32b. The tag is stored in the memory unit 32c, and is representative of the indexes given to the pieces of status information estimated in parallel to one another.

When the job to be requested is the data retrieval, the condition analyzer 31c analyzes the instruction, and determines search conditions for a piece or pieces of status information, an index/indexes and a tag/tags as by step SP35. If the search conditions represent determination of the logical relation, the search conditions are supplied from the condition analyzer 31c to the logic relation analyzer 31j. The logic relation analyzer 31j checks the contents of the memory 32 to see what pieces of status information concern the AND relation and the OR relation as by step SP36, and supplies the search results to the output unit 30b as by step SP40.

If the search conditions represent estimation of a failure propagation path, the failure path analyzer 31k determines a linkage of the AND relation as by step SP41, and supplies the result to the output unit 30b.

On the other hand, if the search conditions do not represent the determination of logical relation nor the determination of a failure origin, the data retriever 31f searches the memory 33 for a piece/pieces of status information, an index/indexes and/or a tag/tags satisfying the search conditions, and supplies the search result to the output unit 30b as by step SP42.

When the output unit 30b receives the search result or the analysis result, the output unit 30b produces a report from the search result or the analysis report, and supplies the report to the analyst or the diagnostic system 33 as by step SP43.

When the instruction requests an elimination job, the condition analyzer 31d determines search conditions for a piece or pieces of status information, an index/indexes and/or a tag/tags to be eliminated as by step SP36, and the search conditions are supplied to the data eliminator 31g. The data eliminator 31g searches the memory 33 for a piece or pieces of status information, an index/indexes and/or a tag/tags satisfying the search conditions, and eliminates the piece or pieces of status information, the index/indexes and/or the tag/tags from the contents of the memory 33 as by step SP44.

Figure 8:
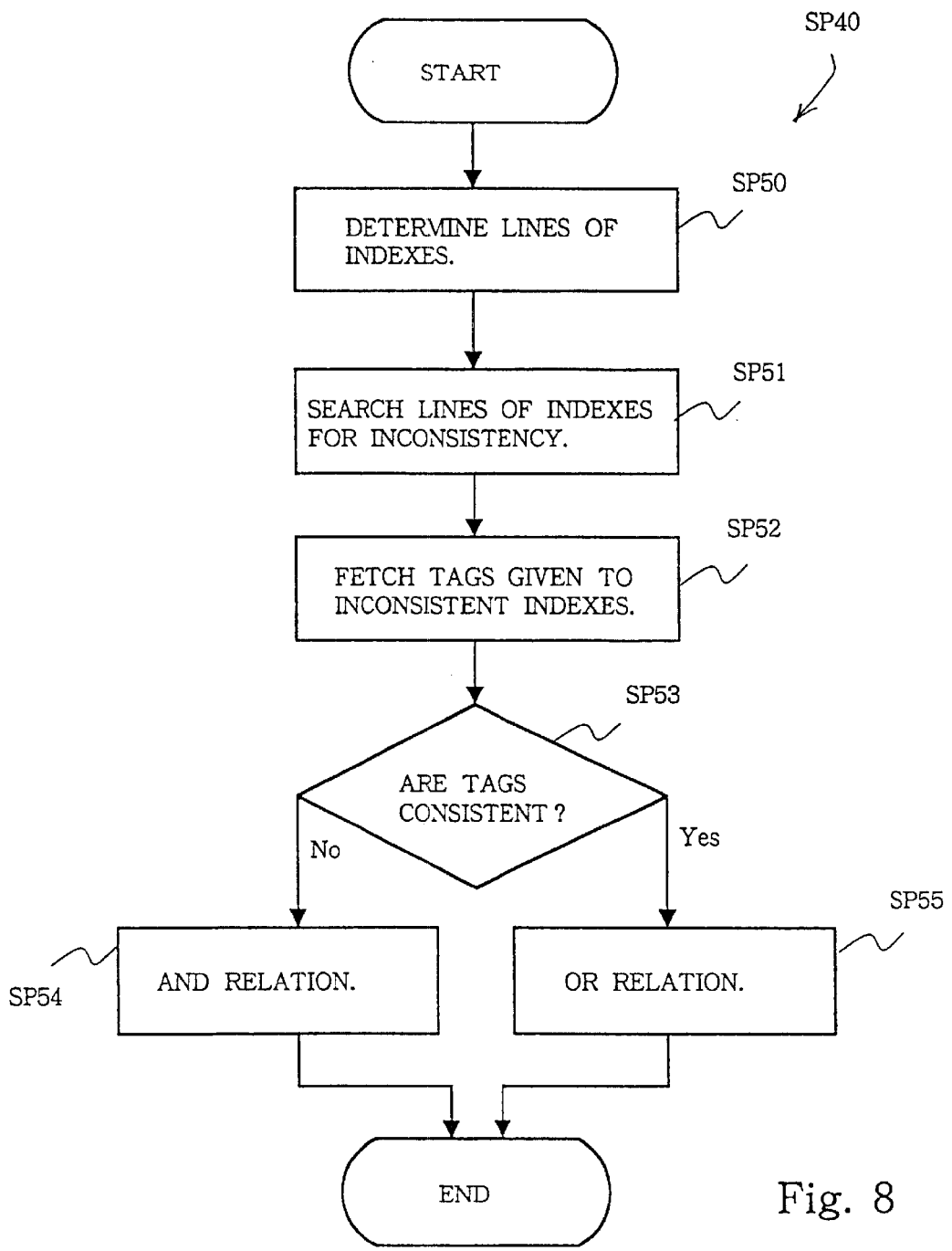
FIG. 8 is a flow chart showing a program sequence executed by a logical relation analyzer 31*j*.
Figure 9:
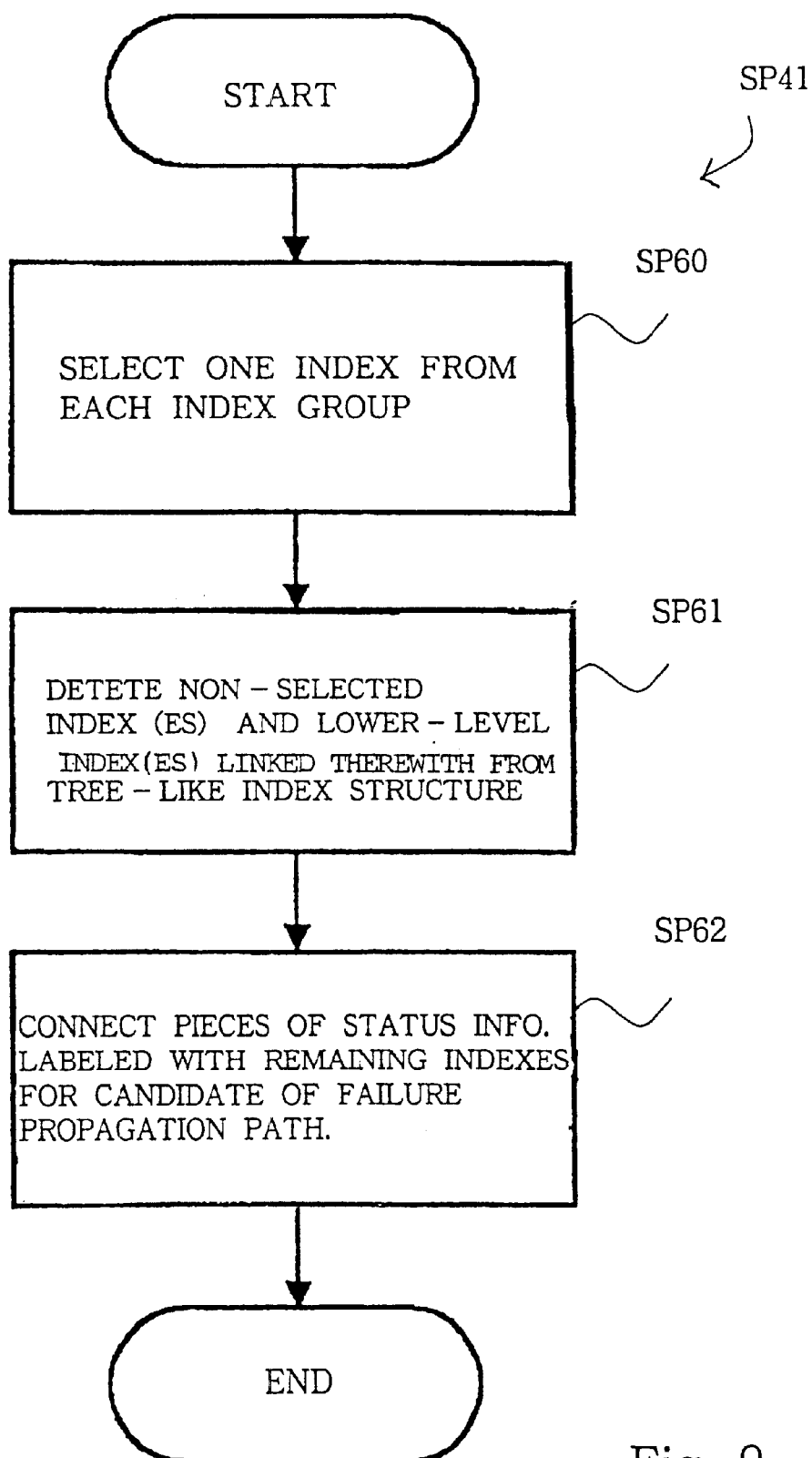
FIG. 9 is a flow chart showing a program sequence executed by a failure path analyzer.

Subsequently, description is made on the determination of logical relation at step SP40 in detail with reference to FIG. 8. The logical relation analyzer 31f receives the search conditions from the condition analyzer 31c, and starts a program sequence shown in FIG. 8. The logical relation analyzer 31f firstly sequentially fetches the indexes stored in the memory unit 32b, and determines lines of the indexes incorporated in the tree-like index structure as by step SP50. Subsequently, the logical relation analyzer 31f sequentially compares the lines of indexes with one another from the highest level indexes toward the lowest-level indexes, and repeatedly checks indexes of the lines to see whether there is inconsistency between the index of one of the lines and the index of another line as by step SP51.

If the logical relation analyzer 31j finds the inconsistency between the indexes, the logical relation analyzer 31j fetches the tags respectively given to the inconsistent indexes as by step SP52, and, thereafter, proceeds to step SP53. The logical relation analyzer 31j compares the tags to see whether or not the tags are consistent with one another as by step SP53. If the tags are inconsistent, the answer at step SP53 is given negative, and the logical relation analyzer 31j determines the associated pieces of status information to be in the AND relation as by step SP54. On the other hand, if the tags are consistent, the answer at step SP53 is given affirmative, and the logical relation analyzer 31j determines the associated pieces of status information to be in the OR relation as by step SP55.

Subsequently, description is made on the estimation of failure propagation path at step SP41 with reference to FIG. 8. When the search conditions are supplied from the condition analyzer 31c to the failure path analyzer 31k, the failure path analyzer 31k accesses the memory unit 32c, and selects one index from each of the index groups respectively assigned the tags as by step SP60. Subsequently, the failure path analyzer 31k deletes non-selected indexes and lower-level index or indexes linked with the non-selected indexes from the tree-like index structure as by step SP61. The non-eliminated indexes are in the AND relation.

The failure path analyzer 31k proceeds to step SP62, and connects the pieces of status information respectively labeled with the remaining indexes. Then, the failure path analyzer determines a candidate of the failure propagation path.

Figure 10:
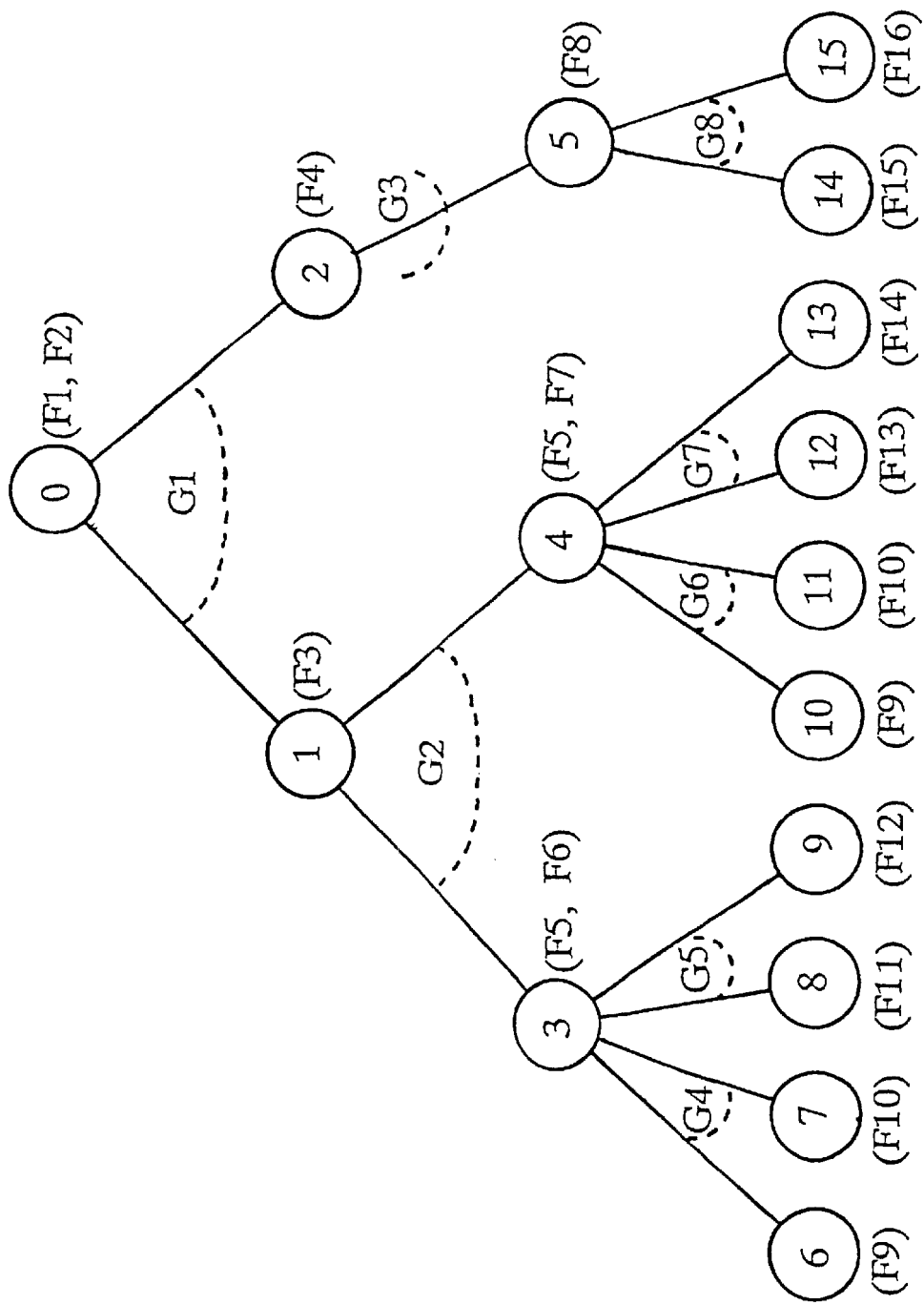
FIG. 10 is a view showing a tree-like index structure having index groups respectively labeled with tags.

FIG. 10 illustrates a tree-like index structure stored in the memory unit 32b. Numerals "0", "1", "2", "3", "4", "5", "6", "7", "8", "9", "10", "11", "12", "13", "14" and "15" are the indexes, which are given to the pieces of status information associated with the nodes F1/F2, F3, F4, F5/F6, F5/F7, F8, F9, F10, F11, F12, F13, F14, F15 and F16, respectively. The tree-like index structure includes plural index groups, and the index groups are respectively labeled with the tags G1/G2/G3/G4/G5/G6/G7/G8. Description is hereinbelow made on the construction for the tree-like index structure and determination of a failure origin with concurrent reference to FIGS. 7, 8, 9, 10, 4 and 5.

Unexpected output signals are assumed to appear at the nodes F1/F2. The input unit 30a transfers an instruction for a data retrieval to the data processing unit 31, and the instruction analyzer 31a interprets the instruction to be a request for the data retrieval, and the answer at step SP32 is given affirmative. Then, the condition analyzer 31c determines the search conditions to be a node or nodes not estimated yet at step SP35. The search conditions are supplied to the data retriever 31f, and the data retriever 31f searches the memory 32 for a node or nodes not estimated yet. The nodes F1/F2 satisfy the search conditions. The data retriever 31f finds the nodes F1/F2 labeled with index "0", and informs the output unit 30b that the nodes F1/F2 labeled with index "0" have not been analyzed yet at step SP43. The output unit 30b also informs the diagnostic system 33 that the nodes F1/F2 have not been analyzed yet.

The diagnostic system 33 identifies a circuit related to the nodes F1/F2 with the circuit A (see FIGS. 4 and 5), and estimates the logic status expressed by two pieces of status information. The two pieces of status information are indicative of two failure propagation paths, respectively. One of the failure propagation paths is from the node F3 to the nodes F1/F2, and the other failure propagation path is from the node F4 to the nodes F1/F2. Then, the diagnostic system 33 supplies an instruction representative of a data registration through the input unit 30a to the instruction analyzer 31a.

The instruction analyzer 31a interprets the instruction, and determines that the diagnostic system 33 requests the data processing unit 31 to register the pieces of status information. The answer at step SP31 is given affirmative, and the index marker 31b gives new indexes "1" and "2" to the pieces of status information at step SP34. New index "1" is indicative of the failure propagation path from the node F3 to the nodes F1/F2, and other index "2" is indicative of the failure propagation path from the node F4 to the nodes F1/F2. Both indexes "1" and "2" are estimated from the circuit A, and the group organizer 31e gives a tag G1 to the indexes "1" and "2" at step SP37.

The two pieces of status information, the indexes "1"/"2", the upper-level index "0" and the tag G1 are transferred to the register 31g. Each of the pieces of status information contains the node names and the logic values at the nodes, and the register 31g stores the two pieces of status information under the indexes "1"/"2", respectively. The register 31g links the indexes "1"/"2" with the index "0", and stores the indexes "1"/"2" as lower-level indexes of the index "0" in the memory unit 32b. Finally, the register 31g stores the tag G1 together with the indexes "1" and "2" in the memory unit 32c.

Upon completion of the registration, the diagnostic system 33 supplies an instruction for a data retrieval through the input unit 30a to the data processing unit 31, and the instruction analyzer 31a interprets that the diagnostic system 33 requests a data retrieval. Then, the answer at step SP32 is given affirmative, and the condition analyzer 31c determines that the search conditions are a node or nodes not estimated yet at step SP35. The search conditions are supplied to the data retriever 31f.

The data retriever 31f searches the memory 32 for a node or nodes not estimated yet at step SP42, and finds that the nodes F3/F4 satisfy the search conditions. The data retriever 31f transfers the search result to the output unit 30b, and the output unit 30b informs that the node F3 labeled with the index "1" and the node F4 labeled with the index "2" have not been analyzed yet.

The diagnostic system 33 identifies circuit B and another circuit (not shown) to be related to the nodes F3/F4. The diagnostic system 33 estimates the logic status of the circuit B, and obtains two logic values. In other words, the diagnostic system 33 acquires two pieces of status information, one of which represents a failure propagation path from nodes F5/F6 to the node F3 (see FIG. 4), and the other of which represents another failure propagation path from the nodes F5/F7 to the node F3 (see FIG. 5).

The diagnostic system supplies an instruction through the input unit 30a to the data processing unit 31, and the instruction analyzer 31a interprets that the diagnostic system 33 requests a data registration for the pieces of status information representative of the failure propagation paths from the nodes F5/F6 to the node F3 and the other failure propagation path from the nodes F5/F7 to the node F3. Then, the answer at step SP31 is given affirmative, and the index marker 31b labels the pieces of status information with index "3" and index "4", respectively, at step SP34. The group organizer 31e gives a tag G2 to the indexes "3" and "4" at step SP37. The register 31g stores the pieces of status information representative of the two failure propagation paths and the indexes "3" and "4" in the memory unit 32a, and connects the indexes "3" and "4" to the index "1". The register 31g further stores the indexes "3" and "4" together with the tag G2 in the memory unit 32c.

The diagnostic system 33 further estimates the logic status of the other circuit (not shown), and acquires a piece of status information representative of a failure propagation path from the node F8 to the node F4. The piece of status information representative of the failure propagation path from the node F8 to the node F4 is labeled with index "5", and the group organizer 31e gives a tag G3 to the index "5". The register 31g stores the piece of status information labeled with index "5" in the memory unit 32a, and connects the index "5" to the index "2". The register 31g stores the tag G3 for the index "5" in the memory unit 32c.

Upon completion of the registration, the diagnostic system 33 supplies an instruction through the input unit 30a to the data processor 31, and the instruction analyzer 31a interprets that the diagnostic system 33 requests a data retrieval for a node or nodes not estimated yet. The condition analyzer 31c determines the search conditions to be a node or nodes not estimated yet, and the data retriever 31f searches the memory 32 for a node or nodes satisfying the search conditions. The data retriever 31f finds that the nodes F5/F6 labeled with the index "3", the nodes F5/F7 labeled with the index "4" and the node F8 labeled with the index "5" satisfy the search conditions.

The diagnostic system 33 repeats the estimation, and requests the data processing unit 31 to store pieces of status information representative of failure propagation paths from the nodes F9/F10/F11/F12 to the nodes F5/F6, pieces of status information representative of failure propagation paths from the nodes F9/F10/F13/F14 to the nodes F5/F7 and pieces of status information representative of failure propagation paths from the nodes F15/F16 to the node F8. The index marker 31b gives indexes "6", "7", "8" and "9" to the pieces of status information representative of the failure propagation paths from the nodes F9/F10/F11/F12 to the nodes F5/F6, respectively, indexes "10", "11", "12" and "13" to the pieces of status information representative of failure propagation paths from the nodes F9/F10/F13/F14 to the nodes F5/F7, respectively, and indexes "14" and "15" to the pieces of status information representative of failure propagation paths from the nodes F15/F16 to the node F8, respectively. The group organizer 31e gives tags G4, G5, G6, G7 and G8 to the indexes "6"/"7", the indexes "8"/"9", the indexes "10"/"11", the indexes "12"/"13" and the indexes "14"/"15", respectively. The pieces of status information, the indexes and the tags are stored in the memory 32 as similar to those described hereinbefore, and the tree-like index structure is completed as shown in FIG. 10.

Figure 1:
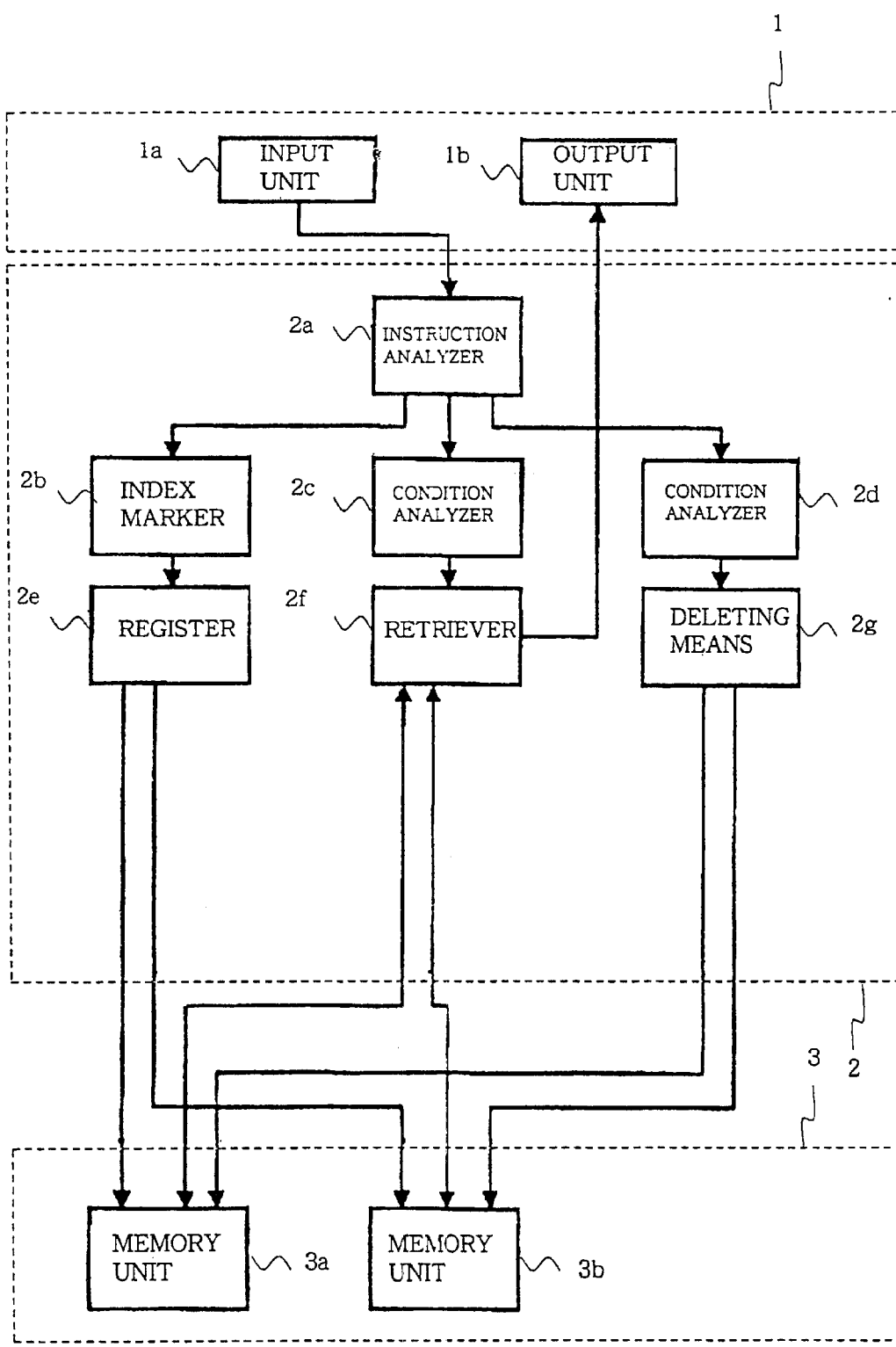
FIG. 1 is a block diagram showing the prior art failure analysis system.
Figure 2:
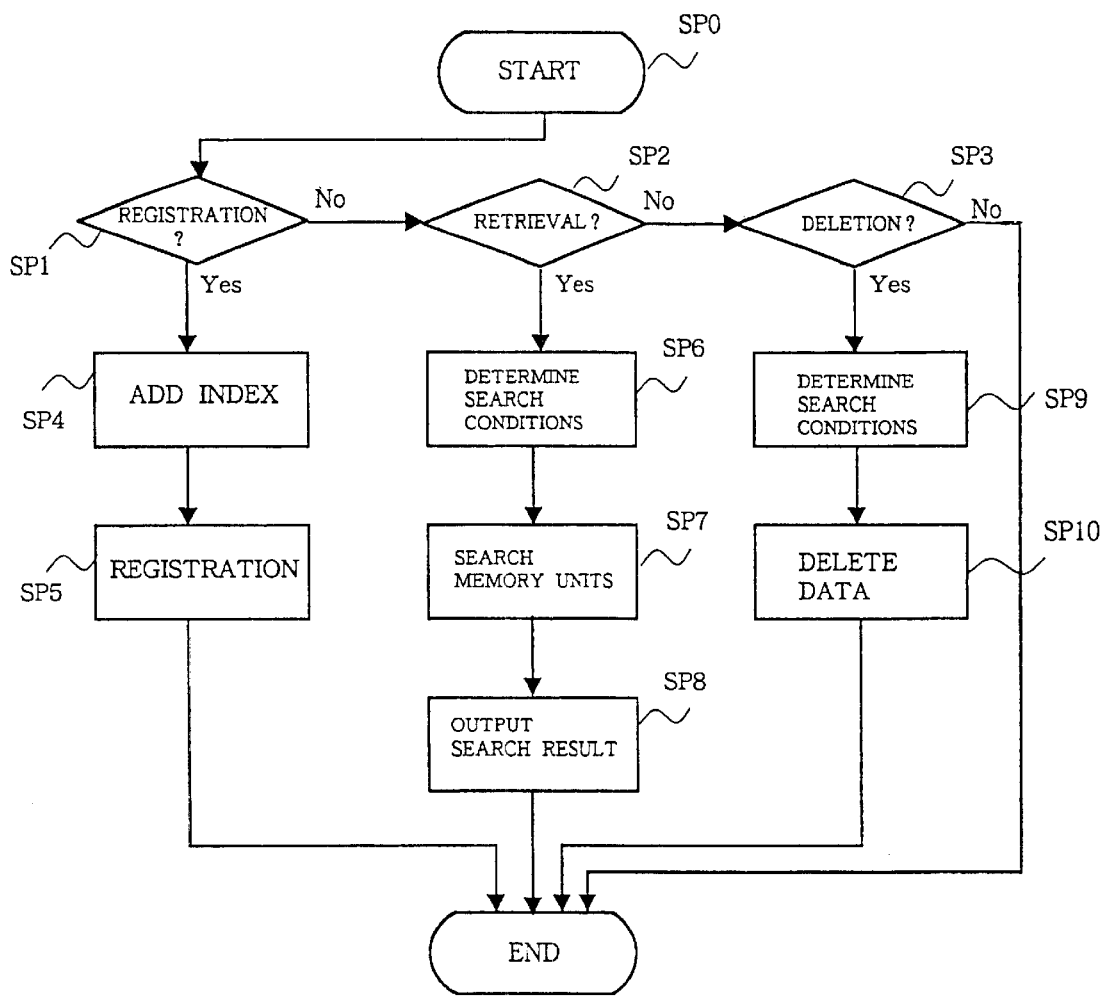
FIG. 2 is a flow chart showing the program sequence of the prior art failure analysis system.
Figure 3:
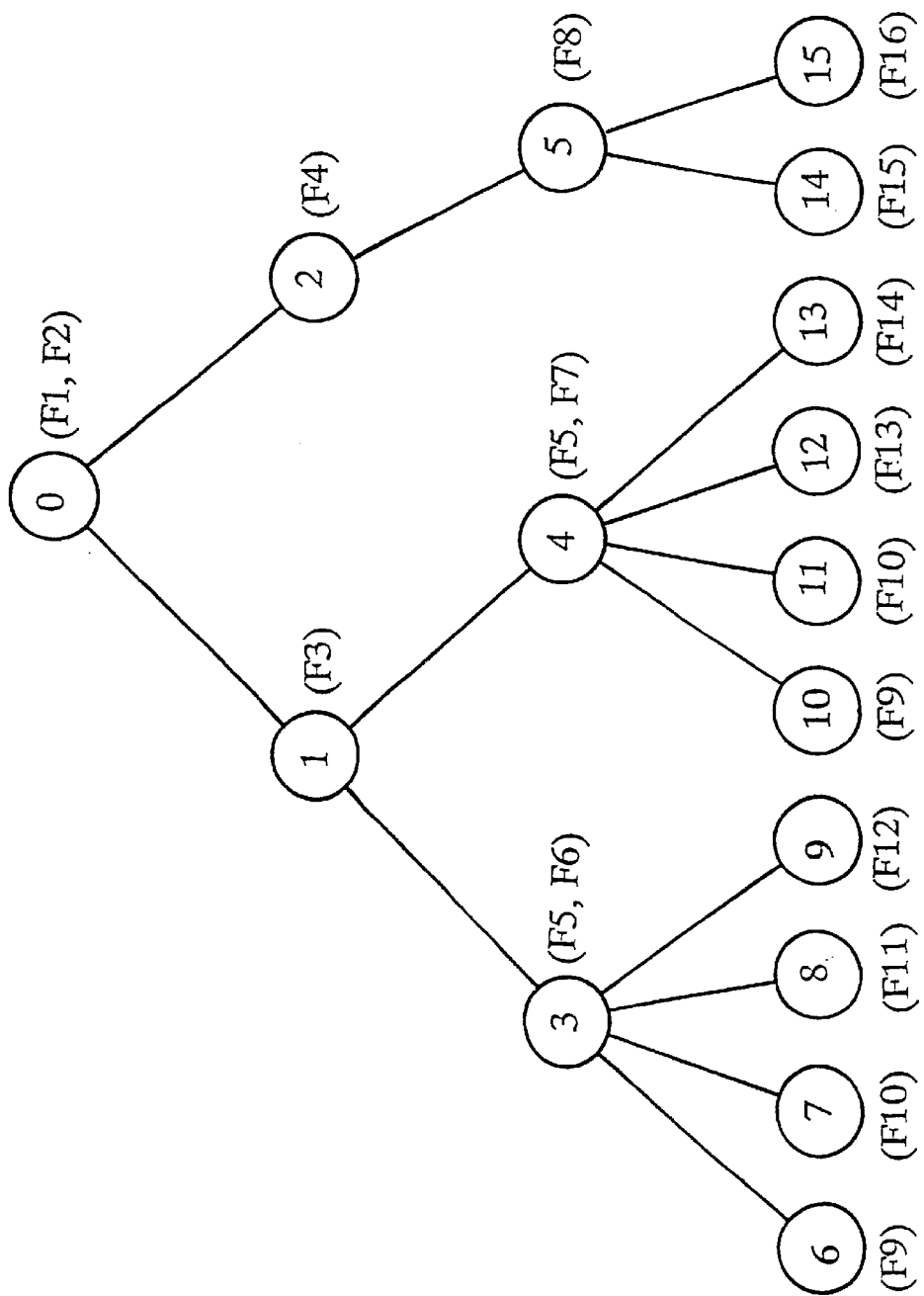
FIG. 3 is a view showing the tree-like index structure achieved through the prior art control sequence.
Figure 4:
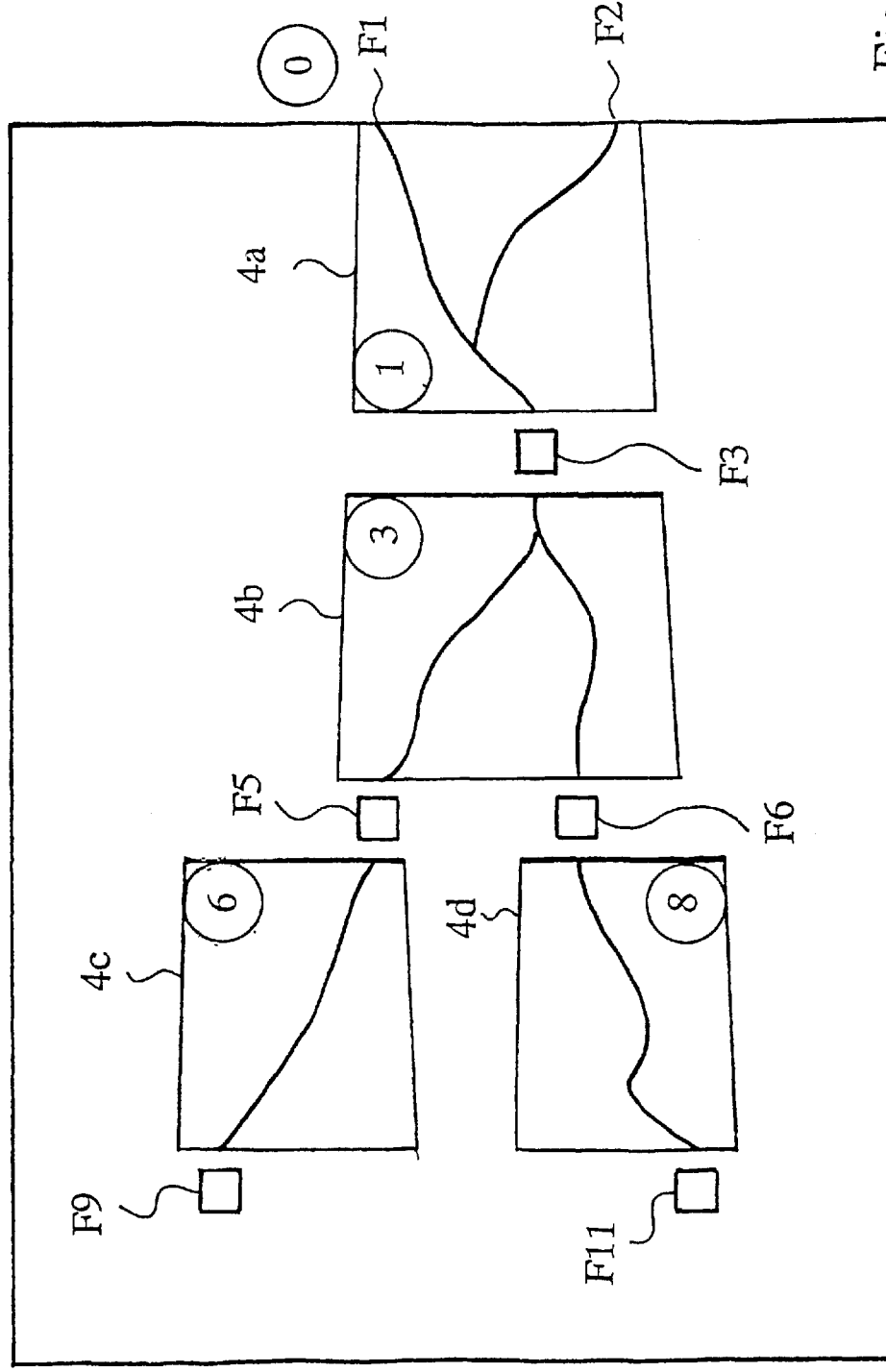
FIG. 4 is a view showing the part of the combinational circuit analyzed by the prior art failure analysis system.

The indexes "1" to "15" are connected through solid lines, and the solid line represents the relation between an upper-level index and lower-level indexes. Therefore, the solid lines teach the direction of estimation. For example, the failure propagation paths shown in FIG. 4 are estimated as follows. The node F3 is determined from the logic value labeled with the index "1" which is estimated on the basis of the pieces of status information at the nodes F1/F2 labeled with the index "0". The nodes F5/F6 are determined from the logic value labeled with the index "3" which is estimated on the basis of the piece of status information at the node F3, and the nodes F9 and F11 are respectively determined from the logic values labeled with the indexes "6" and "8" which are estimated on the basis of the pieces of status information at the nodes F5/F6.

Figure 5:
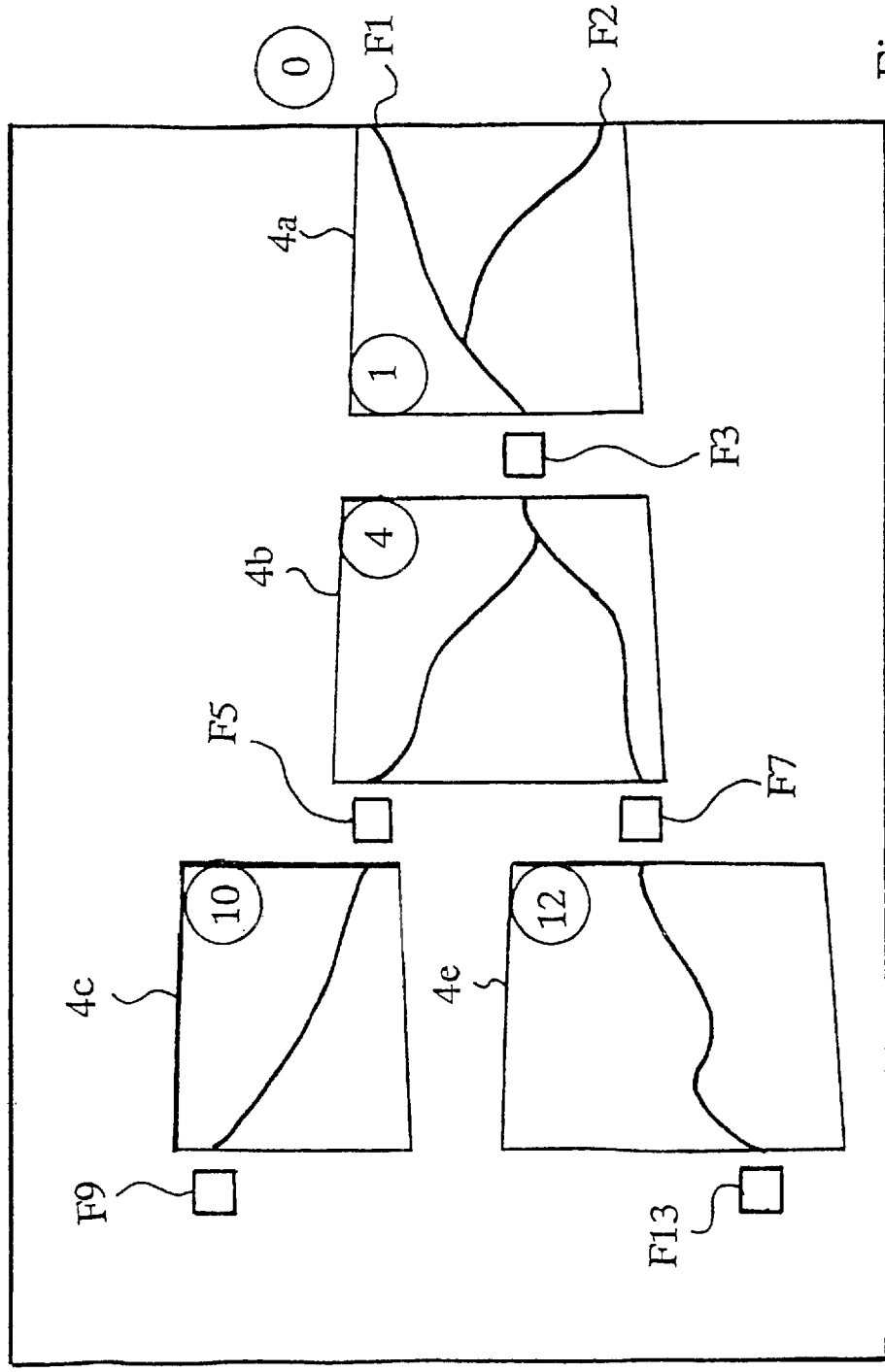
FIG. 5 is a view showing the part of another combinational circuit analyzed by the prior art failure analysis system.

Similarly, the failure propagation paths shown in FIG. 5 are estimated as follows. The node F3 is determined from the logic value labeled with the index "1" which is estimated on the basis of the pieces of status information at the nodes F1/F2 labeled with the index "0". The nodes F5/F7 are determined from the logic value labeled with the index "4" which is estimated on the basis of the piece of status information at the node F3, and the nodes F9 and F13 are respectively determined from the logic values labeled with the indexes "10" and "12" which are estimated on the basis of the pieces of status information at the nodes F5/F7. Thus, the solid lines indicates the direction of estimation such as, for example, from the index "0" through the indexes "1" and "3" to the index "6".

The tags G1, G2, G3, G4, G5, G6, G7 and G8 allow the logical relation analyzer 31f to make the logical relations between the pieces of status information clear. Assuming now that the logical relation analyzer 31j analyzes the logical relation between the piece of status information labeled with the index "6" and the piece of status information labeled with the index "8", the logical relation analyzer 31j firstly checks the tree-like index structure to see whether any lines of indexes are found between the highest level index "0" and the target indexes "6" and "8". The logical relation analyzer 31j finds that the indexes "0" and "6" are incorporated in the line of indexes through the indexes "1" and "3" and that the indexes "0" and "8" are incorporated in another line of indexes through the indexes "1" and "3" at step SP50. The two lines of indexes are consistent until the index "3", and are branched from the index "3" to the indexes "6" and "8". In other words, only the failure propagation path from the index "3" to the index "6" is different from the failure propagation path from the index "3" to the index "8". Thus, the logical relation analyzer 31j determines the indexes "6" and "8" to be inconsistent with one another at step SP51.

When the inconsistent indexes are determined, the logical relation analyzer 31j checks the memory unit 32c to see what tags are given to the inconsistent indexes "6" and "8". The logical relation analyzer 31j finds that the tags G4 and G5 are given to the indexes "6" and "8", respectively, at step SP52.

The tag given to the index "6" is inconsistent with the tag given to the index "8". Then, the answer at step SP53 is given negative, and the logical relation analyzer 31j determines the indexes "6" and "8" to be in the AND relation at step SP54.

Subsequently, the logical relation analyzer 31j analyzes the logical relation between the index "6" and the index "12". The logical relation analyzer 31j determines the lines of indexes, and finds indexes branched from an index shared between the lines of indexes. The indexes "0" and "1" are shared between the lines of indexes, and the indexes "3" and "4" are branched from the index "1". The tag G2 is given to both indexes "3" and "4". Then, the answer at step SP53 is given affirmative, and the logical relation analyzer 31j determines the indexes "6" and "12" to be in the OR relation at step SP55. In this way, the logical relation is successively determined on the basis of the tree-like index structure and the tags given to the indexes.

The failure path analyzer 31k estimates a candidate of the failure propagation path as follows. First, the failure path analyzer 31k select an index from each of the index groups (see step SP60 in FIG. 9). The indexes 1, 3, 5, 6, 8, 10, 12 and 14 are, by way of example, selected from the index groups G1, G2, G3, G4, G5, G6, G7 and G8, respectively, at step SP61. Subsequently, the failure path analyzer 31k deletes the non-selected indexes and the lower-level indexes linked with the non-selected indexes from the tree-like index structure. Then, the indexes 0, 1, 3, 6 and 8 are left in the tree-like index structure. The indexes 0, 1, 3, 6 and 8 are indicative of a candidate of the failure propagation path.

Thus, the method of managing estimated logic status proceeds by extracting combinational circuits. A similar method is available for the extraction of a sequential circuit as one block.

As will be understood from the foregoing description, the failure analysis system according to the present invention includes the logical relation analyzer and the failure path analyzer, and those analyzers offers an analysis more useful than that of the prior art failure analysis system. The logic relation analyzer makes the logical relation between the pieces of status information clear, and the failure path analyzer selects candidates of a failure propagation path from the tree-like index structure.

Second Embodiment

Figure 11:
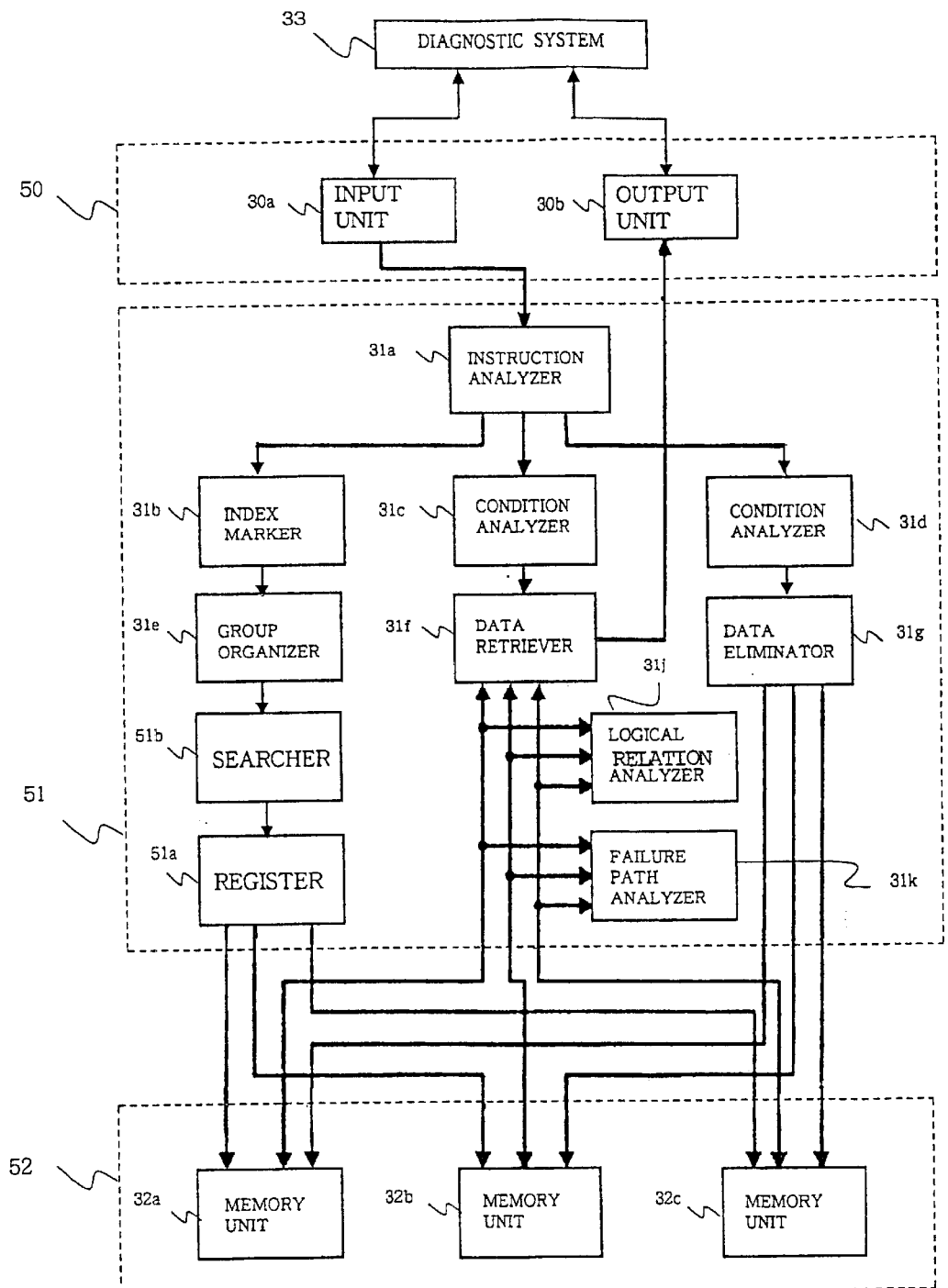
FIG. 11 is a block diagram showing the arrangement of another failure analysis system according to the present invention.

Turning to FIG. 11 of the drawings, another failure analysis system embodying the present invention also comprises a data input-output facility 50, a data processing unit 51 and a data storage 52. The data input-output facility 50 and the data storage 52 are similar to the input-output facility 30 and the data storage 32, and, for this reason, units incorporated therein are labeled with the same references designating corresponding units of the first embodiment without detailed description.

The data processing unit 51 is partially different from the data processing unit 31. The units similar to those of the data processing unit 31 are labeled with the same references as the corresponding units of the data processing unit 31. The register 31g is replaced with a register 51a, and a searcher 51b is inserted between the group organizer 31e and the register 51a.

The searcher 51b checks the pieces of status information to see whether any node has a logic value equal to another node categorized in the same group estimated in parallel. The register 51a behaves as similar to the register 31g except for the case where a piece of logic status is estimated in parallel to another piece of logic status. In detail, the register 51a groups pieces of status information by the index, and stores the pieces of status information in the data storage 52 under the index as similar to the register 31g as long as the pieces of status information were independently estimated. When a piece of status information represents a logic value at a node estimated in parallel to another node, the resister 51a gives the node the upper-level index instead of an index assigned thereto by the index marker 31b. The other registration work is similar to that of the register 31g. The register 51a connects lower-level indexes to an upper-level index, and builds up a tree-like index structure in the memory unit 32b. Moreover, the register 51a stores tags representative of the index groups and the indexes selectively grouped under the tags in the memory unit 32c.

Figure 12:
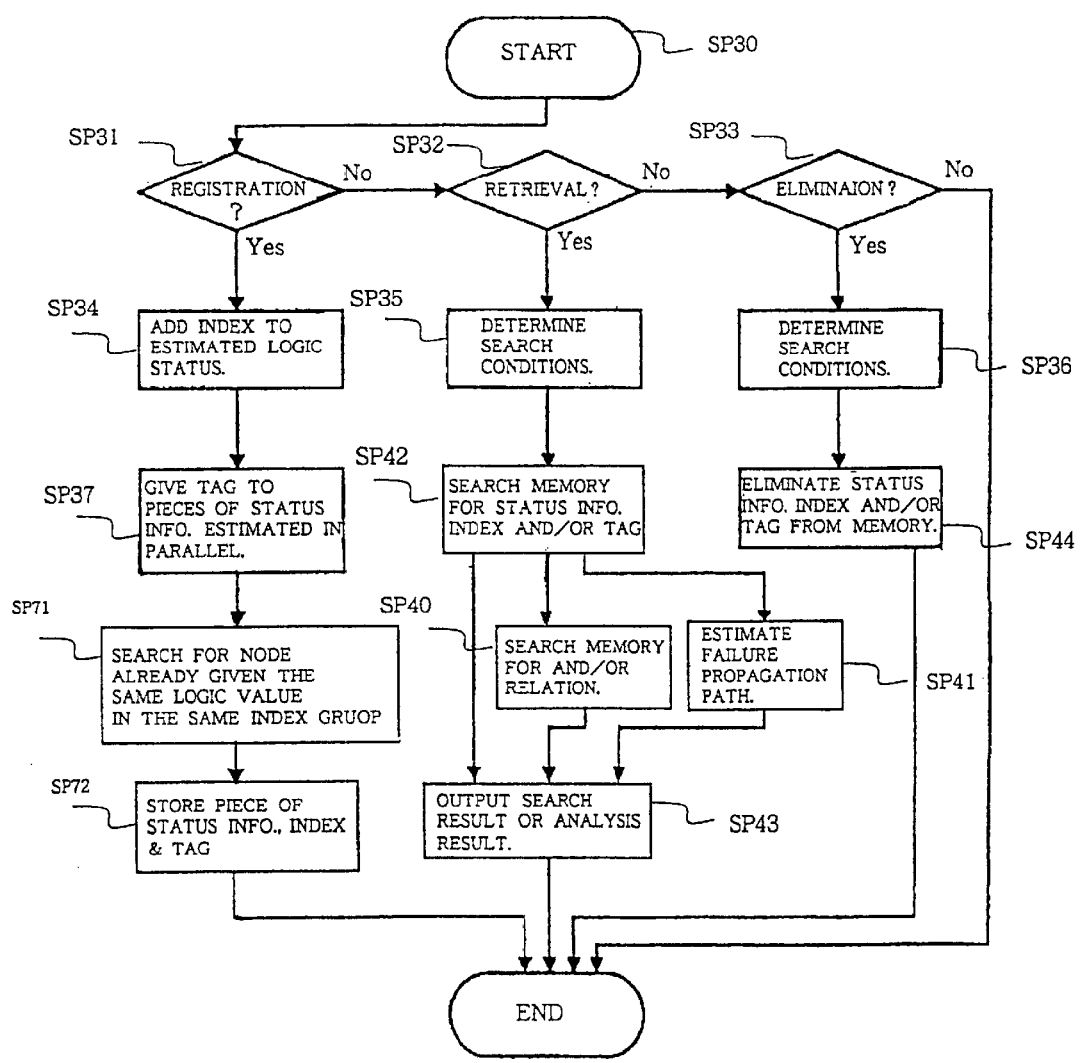
FIG. 12 is a flow chart showing a failure analysis carried out by the failure analysis system.

Description is hereinbelow made on the failure analysis with reference to FIG. 12. The program sequence shown in FIG. 7 is modified so that step SP38 is replaced with steps SP71/SP72. The other steps shown in FIG. 12 are similar to those of the program sequence shown in FIG. 7, and, for this reason, are labeled with the same references designating the corresponding steps without detailed description. The failure analysis system implementing the first embodiment repeats the estimation of logic status for a particular node under different indexes of a node group. The repetition is undesirable, and the failure analysis system shown in FIG. 11 avoids the repetition as follows.

Upon completion of step SP37, the searcher 51b searches the data storage 52 for a node already given the logic value equal to that of the node presently processed in the same index group as by step SP71. If only one piece of status information is acquired through the estimation for a node, the node is registered under the upper-level index. If the searcher 51b can not find the node with the same logic value, the register 51a stores the pieces of status information, the index and the tag for the node presently processed as by step SP72. On the other hand, when the searcher 51b finds the node, the register 51a stores the upper-level index instead of the index given at step SP34 in the memory unit 32a at step SP72.

The above-described modification is detailed with reference to FIGS. 13, 14 and 15. Assuming now that unexpected output signals appear at nodes F1/F2, index "0" was given to the nodes F1/F2, and a piece of status information and index "0" have been already stored in the memory units 32a/32b.

The diagnostic system 33 requests the data processing unit 51 to look for a node or nodes not estimated yet. The instruction analyzer 31a checks the instruction supplied from the diagnostic system 33 to see whether the diagnostic system 33 requests the data processing unit 51 to register, retrieve or eliminate a piece/pieces of status information, index/indexes and/or tag/tags. The instruction analyzer 31a determines that the diagnostic system 33 determines that the diagnostic system 33 requests a data retrieval at step SP32 (se FIG. 12), and the condition analyzer 31c determines the search conditions to be a node or nodes not estimated yet at step SP35. The data retriever 31f searches the data storage 52 for a node or nodes satisfying the search conditions at step SP42. The data retriever 31f finds the nodes F1/F2, and the output unit 30b supplies a search report to the diagnostic system 33 at step SP43.

The diagnostic system 33 extracts a circuit 70a from a sequential circuit 71 on the basis of the nodes F1/F2 labeled with index "0", and estimates the logic status inside thereof. Two pieces of status information respectively are assumed to be estimated. One of the pieces of status information is representative of a failure propagation path from a node F3 to the nodes F1/F2 (see FIGS. 14 and 15), and the other piece of status information represents another failure propagation path from a node F4 to the nodes F1/F2 (see FIG. 13. Then, the diagnostic system 33 instructs the failure analysis system to register the pieces of status information.

The instruction analyzer 31a determines that the diagnostic system 33 requests the data processing unit 51 to store the pieces of status information at step SP31. The index marker 31b gives indexes "1" and "2" to the two pieces of status information, respectively, at step SP34. The group organizer 31e gives a tag G1 to the indexes "1" and "2", because both pieces of status information have been determined on the basis of the logic status inside the circuit 70a.

Although the searcher 51b tries to find a node with the logic value equal to either logic value in the index group G1, there is not any piece of status information, and the register 51a stores the pieces of status information under the indexes "1" and "2" in the memory unit 32a, connects the indexes "1" and "2" to the upper-level index "0" in the memory unit 32b, and stores the indexes "1" and "2" together with the tag G1 in the memory unit 32c at step SP72.

Subsequently, the diagnostic system 33 instructs the failure analysis system to find a node or nodes not estimated yet, and the data retriever 31f finds the nodes F3/F4. The diagnostic system 33 extracts a circuit 70b from the sequential circuit 71, and estimates the logic status inside the circuit 70b. The diagnostic system 33 acquires two pieces of status information through the estimation. One of the pieces of status information is representative of a failure propagation path from nodes F5/F6 to the node F3 (see FIG. 14), and the other piece of status information is representative of another failure propagation path from nodes F5/F7 to the node F3. Although the index marker 31b temporarily gives indexes "3" and "4" to the pieces of status information, the node F5 is shared between the indexes "3" and "4", and the node F5 is stored under the upper-level index "1" as shown in FIG. 13. As a result, only the nodes F6 and F7 are stored under the indexes "3" and "4", respectively, in the memory unit 32a. A tag G2 is given to the indexes "3" and "4". The indexes "3" and "4" are added to the tree-like index structure as lower-level indexes under the upper-level index "1", and the indexes "3" and "4" are stored under the tag G2 in the memory unit 32c.

The diagnostic system 33 further estimates the logic status inside the circuit 70b for the node F4, and acquires a piece of status information representative of a failure propagation path from a node F8 to the node F4. Although the index marker 31b labels the piece of status information with index "5", the logic value to be stored under the index "5" is registered under the upper-level index "2" as shown. The index "5" is inserted into the tree-like index structure as a lower-level index of the index "2", and the index "5" is stored in the memory unit 32c together with a tag G3.

Subsequently, the diagnostic system 33 instructs the data processing unit 51 to find a node or nodes not estimated yet. The data retriever 31f finds the node F5 labeled with the index "1", the node F8 labeled with the index "2", the node F6 labeled with the index "3" and the node F7 labeled with the index "4". The search report is supplied from the output unit 30b to the diagnostic unit 33.

Figure 13:
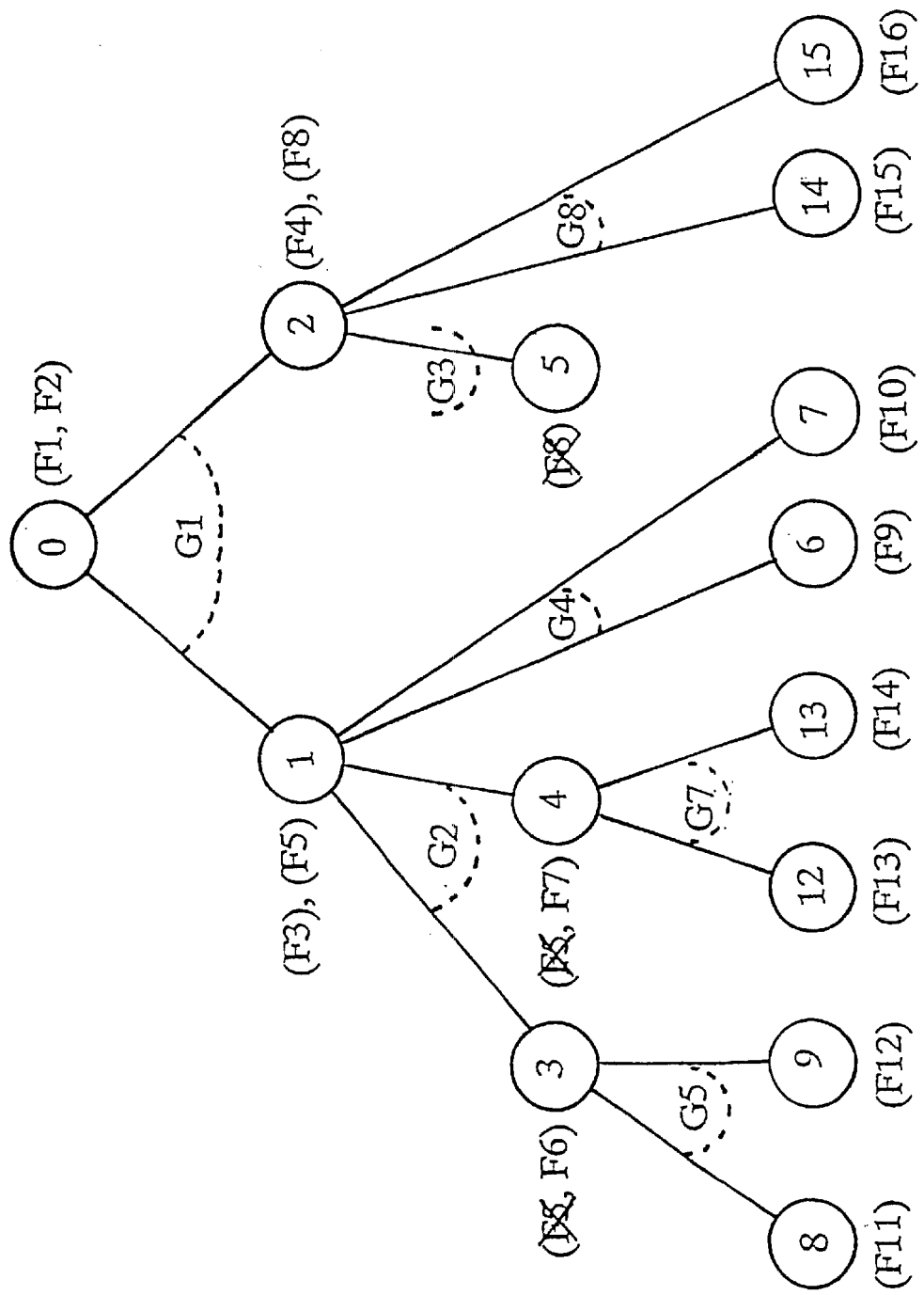
FIG. 13 is a view showing a tree-like index structure having index groups respectively labeled with tags.

In this way, the failure analysis system cooperates with the diagnostic system 33, and builds the tree-like index structure shown in FIG. 13 in the memory unit 32b. The tree-like index structure shown in FIG. 13 is different from the tree-like index structure shown in FIG. 10 in that the nodes F5/F8 shared between different indexes "3" and "4" and solely registered under the upper-level index "2" are moved to the locations labeled with the upper-level indexes "1" and "2". When the diagnostic system requests the failure analysis system to find a node or nodes not estimated yet, the data retriever 31f once finds the node F6 and the node F7, and the diagnostic system 33 does not repeatedly estimate the logic status at the nodes F5. Thus, the failure analysis system reduces the load of the diagnostic system 33.

Figure 14:
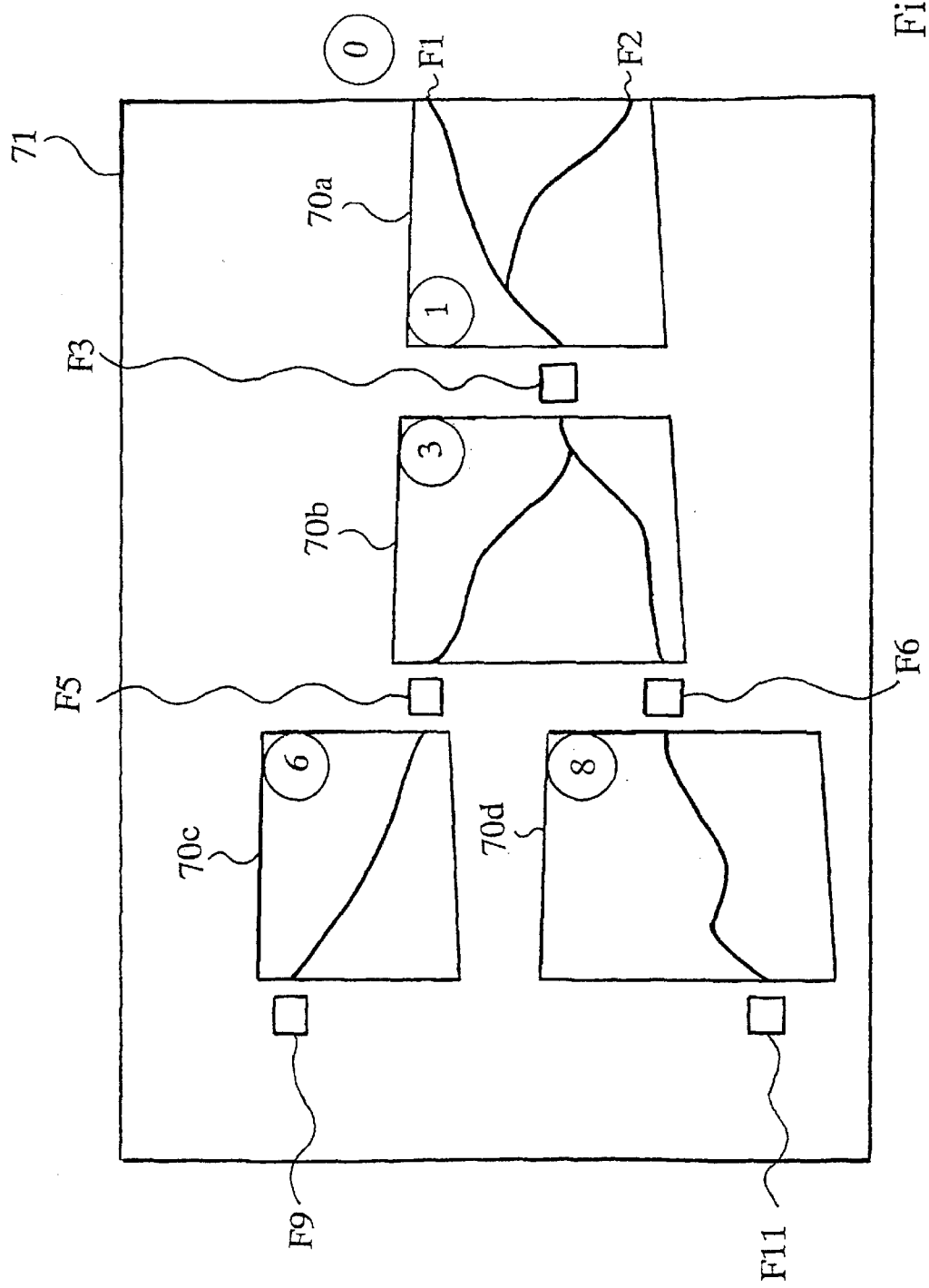
FIG. 14 is a view showing the part of a combinational circuit analyzed by the failure analysis system.

As shown in FIG. 14, the node F3 is determined on the basis of the piece of status information labeled with the index "1" estimated from the circuit 70a relating to the nodes F1/F2, the nodes F5/F6 are determined on the basis of the pieces of status information labeled with the index "3" estimated from the circuit 70b relating to the node F3, and the nodes F9/F11 are determined on the basis of pieces of status information estimated from circuits 70c/70d labeled with the indexes "6" and "8" relating to the nodes F5/F6, respectively.

Figure 15:
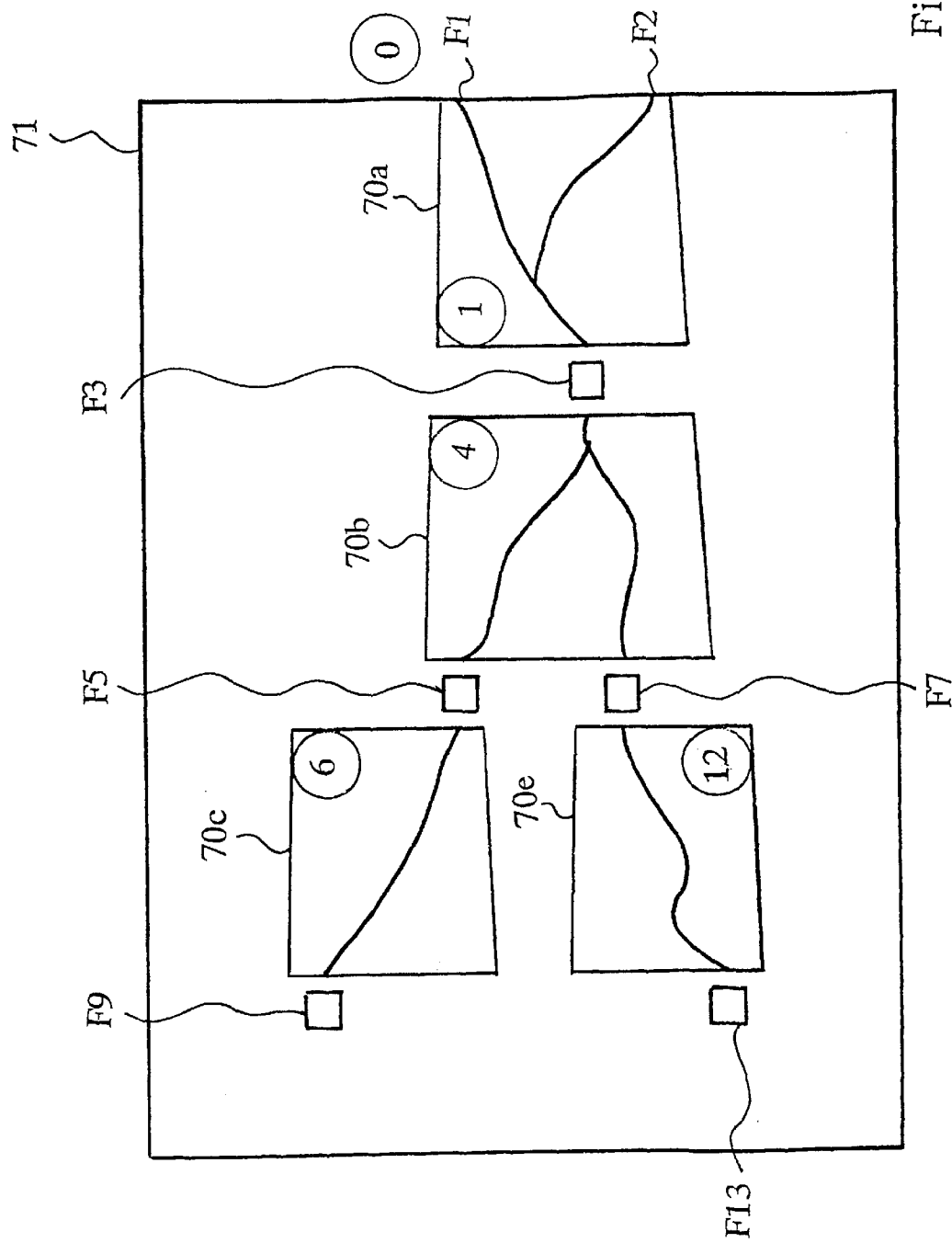
FIG. 15 is a view showing the part of another combinational circuit analyzed by the prior art failure analysis system.

On the other hand, the failure propagation paths shown in FIG. 15 are determined as follows. The node F3 is determined on the basis of the piece of status information estimated from the circuit 70a relating to the nodes F1/F2, the nodes F5/F7 are determined on the basis of pieces of status information estimated from the circuit 70b relating to the node F3, and the nodes F9/F13 are determined on the basis of pieces of status information estimated from circuits 70c/70e relating to the nodes F5/F7, respectively.

If the searcher 51b is not incorporated in the failure analysis system, the diagnostic system 33 twice estimates the logic status inside the circuit 70c. The failure analysis system implementing the second embodiment specifies the node F5 stored under the index "1", and the diagnostic system once estimates the logic status inside the circuit 70c. As a result, the analysis is speed up, and the tree-like index structure consumes memory area less than that consumed by the first embodiment. Of course, the failure analysis system achieves the advantages of the first embodiment.

Third Embodiment

Figure 16:
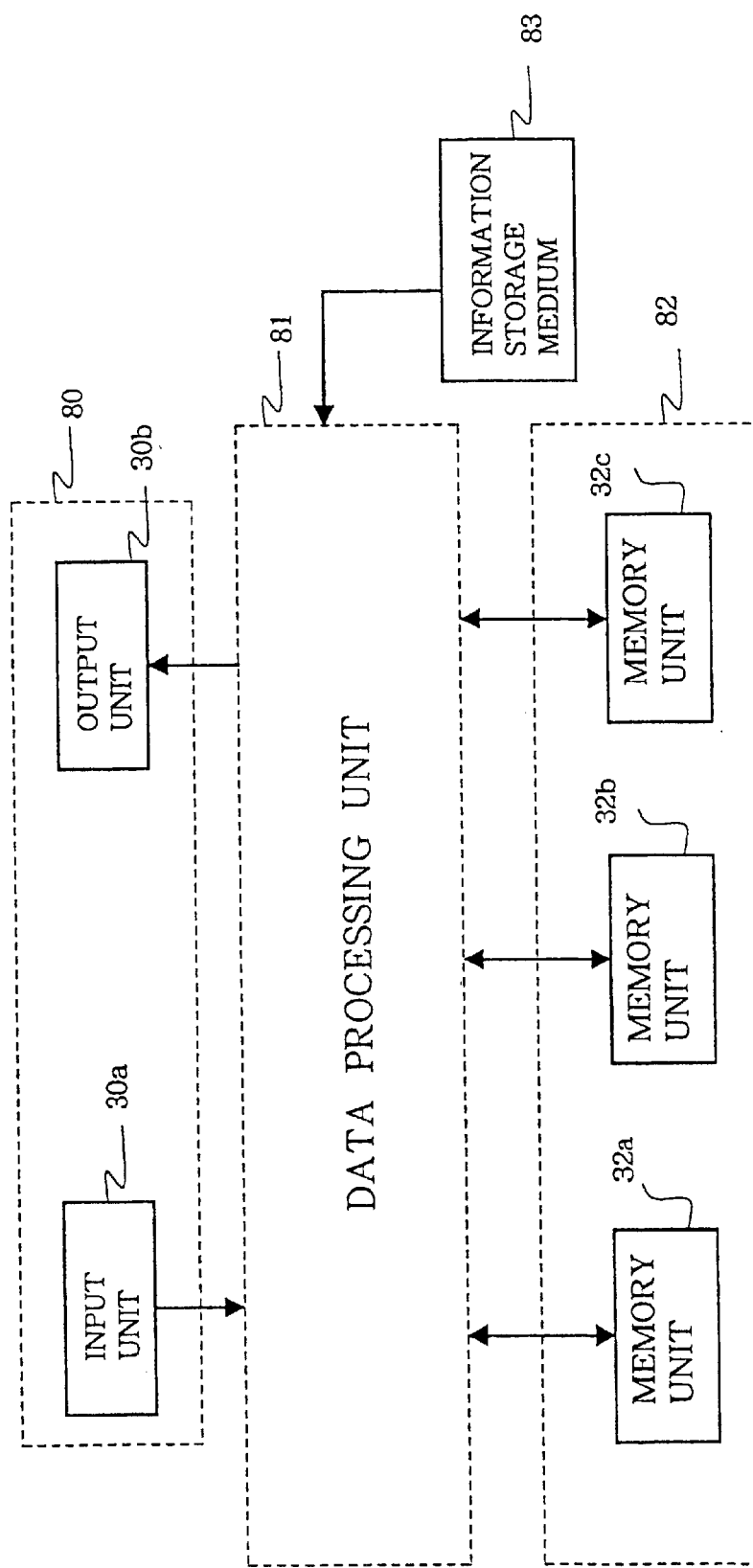
FIG. 16 is a block diagram showing yet another failure analysis system according to the present invention.

FIG. 16 illustrates yet another failure analysis system embodying the present invention. The failure analysis system largely comprises a data input-output facility 80, a data processing unit 81, a data storage 82 and an information storage medium 83. The data input-output facility 80, the data processing unit 81 and the data storage 82 are similar to those of the first or second embodiment, and description is omitted for the sake of simplicity.

The information storage medium 83 is implemented by a magnetic disk, semiconductor memory devices or other kind of information storage medium. The information storage medium 83 stores the program sequence shown in FIG. 7 or 12, and the data processing unit 81 sequentially fetches the instruction codes of the program sequence. The analysis achieved through the program sequence is similar to that of the first or second embodiment, and no further description is incorporated hereinbelow for avoiding repetition.

As will be appreciated from the foregoing description, the failure analysis system according to the present invention determines the logical relation between the pieces of status information by using the tags given to the index group, and estimates the failure propagation path through each combinational circuit. The failure analysis system equipped with the searcher 51b prevents the diagnostic system from a multiple estimation carried out for a node stored under different indexes in the tree-like index structure, and reduces the load of the diagnostic system.

Although particular embodiments of the present invention have been shown and described, it will be apparent to those skilled in the art that various changes and modifications may be made without departing from the spirit and scope of the present invention.

The failure path analyzer selects an index from each index group in the first embodiment. The failure path analyzer may check the index from index "0" toward index "15" so as to select one index from each index group. For example, the failure path analyzer 31k determines that indexes "1" and "2" belong to the index group G1, and, then, selects index "1" from the index group G1. Similarly, the sub-indexes "3" and "4" of the index "1" belong to the index group G2, and the failure path analyzer 31k selects index "3". The indexes "6" and "7" belong to the index group G4 branched from the selected index "3", and the failure path analyzer 31k selects the index "6". Subsequently, the failure path analyzer 31k finds that the indexes "8" and "9" belong to the index group G5 also branched from the selected index "3", and the failure path analyzer 31k selects the index "8". As a result, the failure analyzer 31k determines candidates of the failure path shown in FIG. 4.

What is claimed is:

1. A failure analysis system for a sequential circuit containing plural circuits, comprising:

an index marker receiving pieces of status information each representative of a failure propagation path in one of said plural component circuits, and selectively labeling said pieces of status information with indexes in such as manner one of said pieces of status information is labeled with an index serving as an upper level index with respect to other or others of said pieces of status information closer to candidates of an failure origin than said one of said pieces of status information;

a group organizer checking said indexes to see whether or not one or ones of said indexes are branched from another of said indexes serving as said upper level index, and giving a tag to said one or ones of said indexes when said one or ones of said indexes are branched from said another of said indexes, thereby selectively giving tags to said indexes; and a logical relation analyzer checking said indexes and said tags to see whether more than one piece of status information is established in an AND relation or an OR relation.

2. The failure analyzer as set forth in claim 1, in which said logical relation analyzer determines said more than one piece of status information to be in said AND relation when different tags are given to the indexes of said more than one piece of status information, and determines said more than one piece of status information to be in said OR relation when one of said tags is shared between the indexes given to said more than one piece of status information.

3. The failure analysis system as set forth in claim 1, further comprising a failure path analyzer selecting an index from each of groups of indexes respectively labeled with said tags so as to estimate an overall failure propagation path in said sequential circuit.

4. The failure analysis system as set forth in claim 3, in which the pieces of status information labeled with the indexes selected by said failure path analyzer are established in the AND relation.

5. The failure analysis system as set forth in claim 1, further comprising a searcher checking the pieces of status information to see whether a node of said plural component circuits is represented by one or more than one piece of status information labeled with an index or different indexes branched from another of said indexes serving as said upper level index, and storing said one or more than one piece of status information under said another of said indexes.

6. A method of managing estimated logic status for a sequential circuit containing plural component circuits, comprising the steps of:

a) acquiring pieces of status information each representative of a degradation of a failure propagation path in one of said plural component circuits and selectively labeled with indexes to be built in a tree-like index structure so as to indicate a relation of the failure propagation paths from candidates of a failure origin in said sequential circuit to a signal output port of said sequential circuit, one of said indexes given to one of said propagation paths closer to said signal output port serving as an upper level index in said tree-like index structure with respect to other or others of said indexes given to other or others of said propagation paths closer to said candidates and connected to said one of said propagation paths;

b) checking said tree-like index structure to see whether one of or ones of said indexes are branched from another of said indexes serving as said upper level index so as to give a tag to said one or ones of said indexes when said one or ones of said indexes are branched from said another of indexes, thereby selectively giving tags to an index or a group of indexes incorporated in said tree-like index structure;

c) checking said indexes to see whether or not said tag is shared between more than one of said indexes; and d) determining a logical relation between said more than one of said indexes to be an OR relation when said tag is shared and an AND relation when said tag is not shared.

7. The method as set forth in claim 6, further comprising the step of e) estimating an overall failure propagation path from one of said candidates to said signal output port by selecting one of the indexes labeled with one of said tags.

8. The method as set forth in claim 7, in which the indexes given to the pieces of status information representative of the failure propagation paths forming said overall failure propagation path are in the AND relation.

9. The method as set forth in claim 7, further comprising the steps of
f) checking said pieces of status information to see whether or not a node of said component circuit is shared between more than one piece of status information respectively labeled with different indexes branched from another of said indexes serving as said upper level index after said step a), and
g) giving the piece of-status information indicative of said node the upper level index from which the indexes of said more than one piece of status information are branched between said step f) and said step b).

10. An information storage medium for storing a sequence of programmed instruction for a method of managing estimated logic status for a sequential circuit containing plural component circuits, comprising the steps of:
a) acquiring pieces of status information each representative of a degradation of a failure propagation path in one of said plural component circuits and selectively labeled with indexes to be built in a tree-like index structure so as to indicate a relation of the failure propagation paths from candidates of a failure origin in said sequential circuit to a signal output port of said sequential circuit, one of said indexes given to one of said propagation paths closer to said signal output port serving as an upper level index in said tree-like index structure with respect to other or others of said indexes given to other or others of said propagation paths closer to said candidates and connected to said one of said propagation paths;
b) checking said tree-like index structure to see whether one of or ones of said indexes are branched from another of said indexes serving as said upper level index so as to give a tag to said one or ones of said indexes when said one or ones of said indexes are branched from said another of indexes, thereby selectively giving tags to an index or a group of indexes incorporated in said tree-like index structure,
c) checking said indexes to see whether or not said tag is shared between more than one of said indexes; and
d) determining a logical relation between said more than one of said indexes to be an OR relation when said tag is shared and an AND relation when said tag is not shared.

11. The method as set forth in claim 10, further comprising the step of e) estimating an overall failure propagation path from one of said candidates to said signal output port by selecting one of the indexes labeled with one of said tags.

12. The method as set forth in claim 11, in which the indexes given to the pieces of status information representative of the failure propagation paths forming said overall failure propagation path are in the AND relation.

13. The method as set forth in claim 11, further comprising the steps of
f) checking said pieces of status information to see whether or not a node of said component circuit is shared between more than one piece of status information respectively labeled with different indexes branched from another of said indexes serving as said upper level index after said step a), and
g) giving the piece of status information indicative of said node the upper level index from which the indexes of said more than one piece of status information are branched between said step f) and said step b).

14. A failure analysis system for a sequential circuit containing plural circuits, comprising:
an index marker receiving as inputs pieces of status information, each of the pieces of status information being representative of a failure propagation path in one of said plural component circuits, the index marker being constructed to selectively label the pieces of status information with indexes to define a relationship between respective said pieces of status information so that a given one of the pieces of status information may be labeled with an index serving as an upper level index with respect to one or more of said pieces of status information that are closer to candidates of a failure origin than said given piece of status information;
a group organizer receiving as an input the index information generated by the index marker, the group organizer being constructed to check said indexes to determine whether each said index is branched from another of said indexes serving as said upper level index, and to assign a common tag to all of said indexes that are branched from a particular one of said indexes; and
a logical relation analyzer constructed to check said indexes and said tags to determine whether a plurality of said pieces of status information share a common said tag and, if so, to determine whether said pieces of status information exist in an AND relation or in an OR relation with one another.

* * * * *